United States Patent
Mohta et al.

(10) Patent No.: US 10,547,278 B2
(45) Date of Patent: Jan. 28, 2020

(54) ACTIVE CROSS-BAND ISOLATION FOR A TRANSFORMER-BASED POWER AMPLIFIER

(71) Applicant: SKYWORKS SOLUTIONS, INC., Woburn, MA (US)

(72) Inventors: Setu Mohta, Pasadena, CA (US); Kyu Hwan An, San Diego, CA (US)

(*) Notice: Subject to any disclaimer, the term of this patent is extended or adjusted under 35 U.S.C. 154(b) by 0 days.

(21) Appl. No.: 16/230,874

(22) Filed: Dec. 21, 2018

(65) Prior Publication Data

US 2019/0238106 A1 Aug. 1, 2019

Related U.S. Application Data

(62) Division of application No. 15/634,674, filed on Jun. 7, 2017, now Pat. No. 10,181,828.

(Continued)

(51) Int. Cl.
| | |
|---|---|
| *H03F 3/21* | (2006.01) |
| *H04B 1/40* | (2015.01) |
| *H04B 1/04* | (2006.01) |
| *H04B 1/16* | (2006.01) |
| *H03F 3/19* | (2006.01) |
| *H03F 3/193* | (2006.01) |

(Continued)

(52) U.S. Cl.
CPC ............. *H03F 3/21* (2013.01); *H03F 3/19* (2013.01); *H03F 3/193* (2013.01); *H03F 3/245* (2013.01); *H03F 3/72* (2013.01); *H04B 1/04* (2013.01); *H04B 1/0458* (2013.01); *H04B 1/0475* (2013.01); *H04B 1/16* (2013.01); *H04B 1/40* (2013.01); *H04B 1/525* (2013.01); *H03F 2200/111* (2013.01); *H03F 2200/451* (2013.01); *H03F 2200/541* (2013.01); *H03F 2203/7209* (2013.01); *H04B 2001/0408* (2013.01)

(58) Field of Classification Search
CPC ... H03F 3/21; H03F 3/72; H03F 3/245; H03F 3/193; H03F 3/19; H03F 2203/7209; H03F 2200/111; H03F 2200/541; H03F 2200/451; H04B 1/525; H04B 1/0475; H04B 1/0458; H04B 1/16; H04B 1/04; H04B 1/40; H04B 2001/0408
USPC .......................................................... 455/73
See application file for complete search history.

(56) References Cited

U.S. PATENT DOCUMENTS

| | | |
|---|---|---|
| 6,501,363 B1 | 12/2002 | Hwu et al. |
| 6,737,948 B2 | 5/2004 | Aoki et al. |

(Continued)

FOREIGN PATENT DOCUMENTS

| | | |
|---|---|---|
| EP | 2204906 A1 | 7/2010 |

OTHER PUBLICATIONS

Search Report dated Nov. 4, 2016 for International Application No. PCT/US2015/067929 in 15 pages.

*Primary Examiner* — Eugene Yun
(74) *Attorney, Agent, or Firm* — Knobbe, Martens, Olson & Bear LLP

(57) ABSTRACT

Embodiments of radio frequency (RF) systems include a plurality of power amplifiers having a primary winding and a secondary winding. Each of the power amplifiers may be configured to process signals of different frequency bands. The primary winding for one power amplifier can be detuned while another power amplifier is being used in a transmit mode. By detuning the power amplifier, power coupling from the transmitting power amplifier can be reduced or eliminated.

20 Claims, 14 Drawing Sheets

Related U.S. Application Data

(60) Provisional application No. 62/356,137, filed on Jun. 29, 2016.

(51) Int. Cl.
*H03F 3/24* (2006.01)
*H03F 3/72* (2006.01)
*H04B 1/525* (2015.01)

(56) References Cited

U.S. PATENT DOCUMENTS

| | | | |
|---|---|---|---|
| 6,816,012 B2 | 11/2004 | Aoki et al. | |
| 6,856,199 B2 | 2/2005 | Komijani et al. | |
| 7,075,371 B2 | 7/2006 | Aoki et al. | |
| 7,095,283 B2 | 8/2006 | Kee et al. | |
| 7,119,619 B2 | 10/2006 | Komijani et al. | |
| 7,157,975 B2 | 1/2007 | Hajimiri et al. | |
| 7,256,573 B2 | 8/2007 | Magoon et al. | |
| 7,269,391 B2 | 9/2007 | Chiu et al. | |
| 7,330,076 B2 | 2/2008 | Komijani et al. | |
| 7,342,457 B2 | 3/2008 | Hajimiri et al. | |
| 7,425,869 B2 | 9/2008 | Aoki et al. | |
| 7,471,153 B2 | 12/2008 | Kee et al. | |
| 7,486,137 B2 | 2/2009 | Magoon et al. | |
| 7,646,249 B2 | 1/2010 | Hajimiri et al. | |
| 7,733,183 B2 | 6/2010 | Komijani et al. | |
| 7,760,025 B2 | 7/2010 | Kee et al. | |
| 7,915,960 B2 | 3/2011 | Kee et al. | |
| 7,920,833 B2 | 4/2011 | Qiao et al. | |
| 7,999,621 B2 | 8/2011 | Hajimiri et al. | |
| 8,018,283 B2 | 9/2011 | Komijani et al. | |
| 8,019,292 B2 | 9/2011 | Magoon et al. | |
| 8,049,563 B2 | 11/2011 | Aoki et al. | |
| 8,049,564 B2 * | 11/2011 | Pallotta | H03F 1/0205 330/276 |
| 8,242,855 B2 | 8/2012 | Kee et al. | |
| 8,285,239 B2 | 10/2012 | Molnar et al. | |
| 8,350,625 B2 | 1/2013 | Komijani et al. | |
| 8,577,312 B2 | 11/2013 | Magoon et al. | |
| 9,031,517 B2 | 5/2015 | Jerng et al. | |
| 9,219,518 B1 | 12/2015 | Chen et al. | |
| RE45,974 E | 4/2016 | Kee et al. | |
| 9,484,977 B2 | 11/2016 | Anderson et al. | |
| 9,882,601 B1 | 1/2018 | Feldman | |
| 10,103,695 B2 | 10/2018 | Jin et al. | |
| 10,135,405 B2 | 11/2018 | Jin et al. | |
| 10,148,233 B2 | 12/2018 | Jin et al. | |
| 2002/0135422 A1 | 9/2002 | Aoki et al. | |
| 2003/0169105 A1 | 9/2003 | Hajimiri et al. | |
| 2003/0169113 A1 | 9/2003 | Komijani et al. | |
| 2003/0179836 A1 | 9/2003 | Masenten | |
| 2003/0184369 A1 | 10/2003 | Aoki et al. | |
| 2005/0030098 A1 | 2/2005 | Aoki et al. | |
| 2005/0140447 A1 | 6/2005 | Komijani et al. | |
| 2005/0184813 A1 | 8/2005 | Kee et al. | |
| 2005/0189995 A1 | 9/2005 | Kee et al. | |
| 2005/0200420 A1 | 9/2005 | Kee et al. | |
| 2005/0255812 A1 | 11/2005 | Na et al. | |
| 2005/0275454 A1 | 12/2005 | Hajimiri et al. | |
| 2006/0017538 A1 | 1/2006 | Magoon et al. | |
| 2006/0170503 A1 | 8/2006 | Lee et al. | |
| 2006/0223456 A1 | 10/2006 | Ouzillou | |
| 2006/0250187 A1 | 11/2006 | Aoki et al. | |
| 2007/0024382 A1 | 2/2007 | Zachan et al. | |
| 2007/0030071 A1 | 2/2007 | Komijani et al. | |
| 2007/0096828 A1 | 5/2007 | Hajimiri et al. | |
| 2007/0298732 A1 | 12/2007 | Lee et al. | |
| 2008/0061875 A1 | 3/2008 | Magoon et al. | |
| 2008/0117894 A1 | 5/2008 | McMorrow | |
| 2008/0204139 A1 | 8/2008 | Komijani et al. | |
| 2008/0211584 A1 | 9/2008 | Hajimiri et al. | |
| 2008/0231535 A1 | 9/2008 | Rofougaran et al. | |
| 2009/0002071 A1 | 1/2009 | Aoki et al. | |
| 2009/0015324 A1 | 1/2009 | Magoon et al. | |
| 2009/0017775 A1 | 1/2009 | Qiao et al. | |
| 2009/0073078 A1 | 3/2009 | Ahn | |
| 2009/0102592 A1 | 4/2009 | Kee et al. | |
| 2010/0117733 A1 | 5/2010 | Hajimiri et al. | |
| 2010/0203844 A1 | 8/2010 | Gorbachov | |
| 2010/0244955 A1 | 9/2010 | Komijani et al. | |
| 2010/0283548 A1 | 11/2010 | Kee et al. | |
| 2011/0003563 A1 | 1/2011 | Gorbachov | |
| 2011/0068636 A1 | 3/2011 | Lee et al. | |
| 2011/0175685 A1 | 7/2011 | Kee et al. | |
| 2012/0025914 A1 | 2/2012 | Kim et al. | |
| 2012/0176200 A1 | 7/2012 | Hajimiri et al. | |
| 2012/0286878 A1 | 11/2012 | Dening et al. | |
| 2013/0078931 A1 | 3/2013 | Jerng et al. | |
| 2013/0257545 A1 | 10/2013 | Jeon | |
| 2013/0267185 A1 | 10/2013 | Chen et al. | |
| 2014/0084700 A1 | 3/2014 | Anderson et al. | |
| 2014/0199951 A1 | 7/2014 | Yu et al. | |
| 2015/0094117 A1 | 4/2015 | Conta et al. | |
| 2015/0236691 A1 | 8/2015 | Cam et al. | |
| 2015/0333791 A1 | 11/2015 | Anderson | |
| 2016/0227603 A1 | 8/2016 | Huang et al. | |
| 2016/0276097 A1 | 9/2016 | Lewis | |
| 2017/0070199 A1 | 3/2017 | Anderson et al. | |
| 2017/0077877 A1 | 3/2017 | Anderson | |
| 2017/0163215 A1 | 6/2017 | Gorbachov et al. | |
| 2017/0250728 A1 | 8/2017 | Afsahi et al. | |
| 2018/0006618 A1 | 1/2018 | Mohta et al. | |
| 2018/0145647 A1 | 5/2018 | Matsuno | |

\* cited by examiner

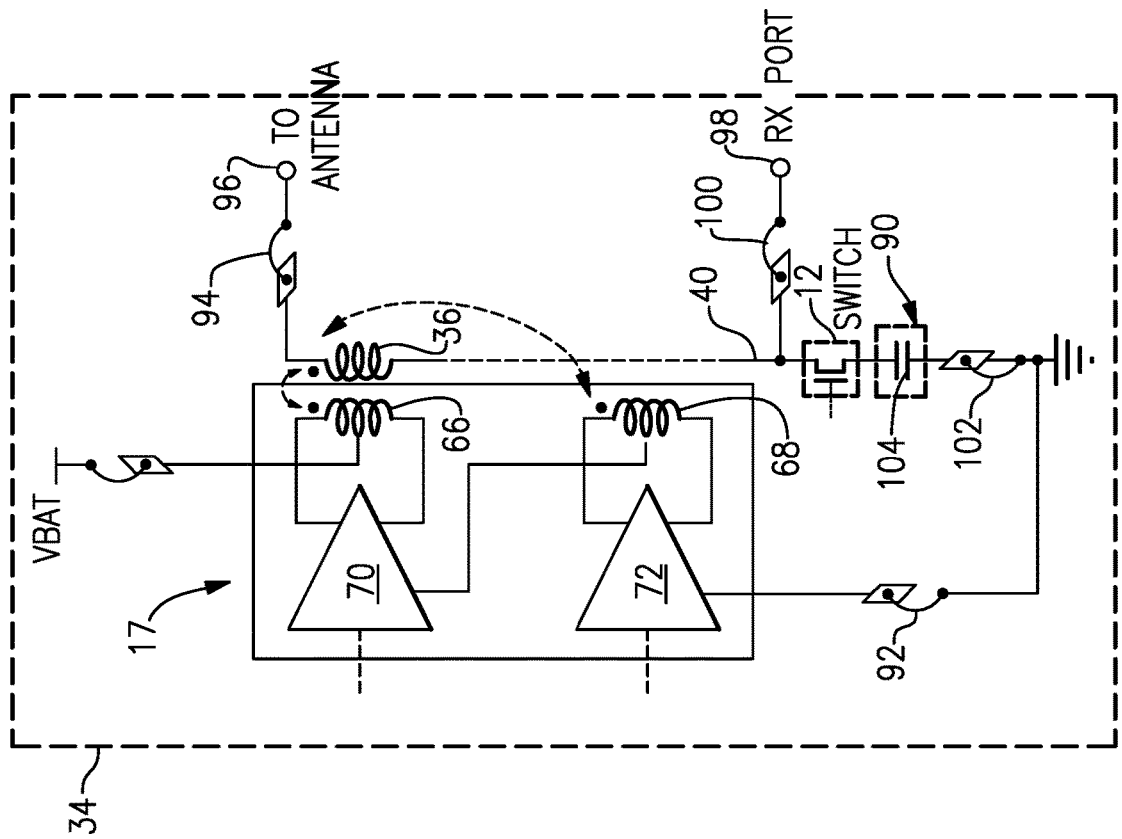
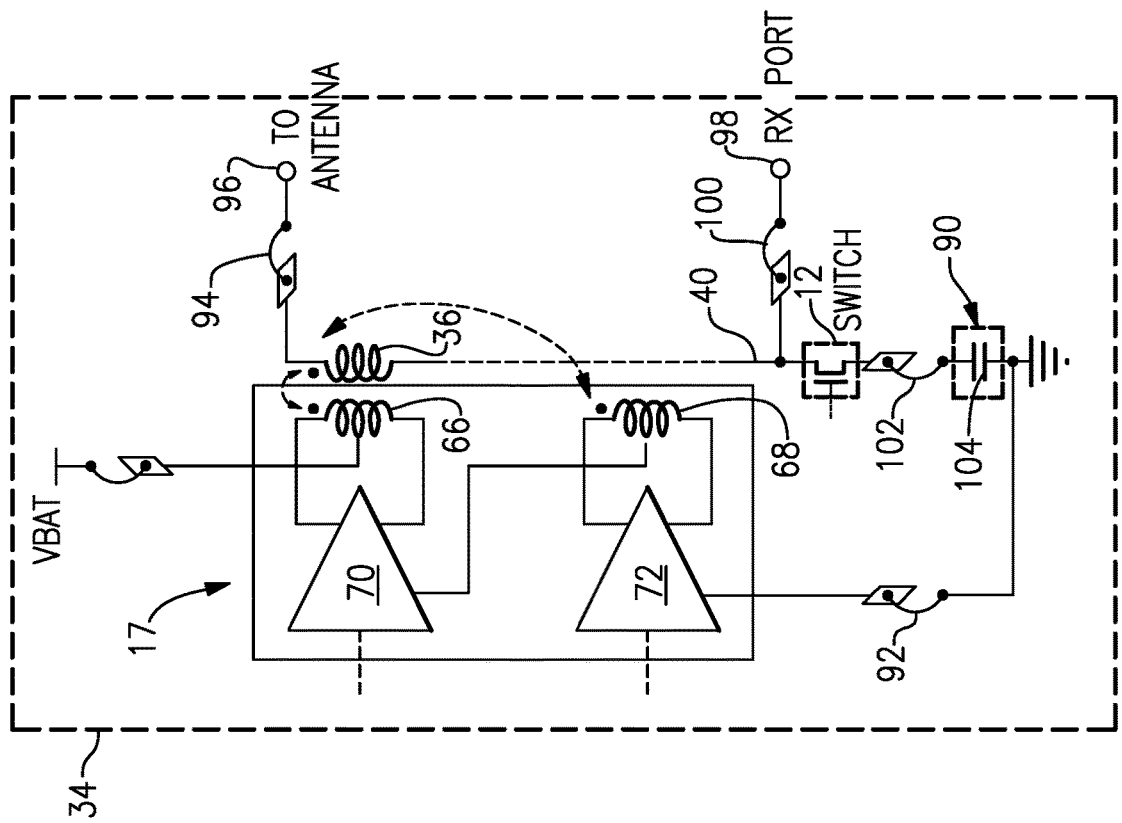

ACTIVE CROSS-BAND ISOLATION FOR A TRANSFORMER-BASED POWER AMPLIFIER

RELATED APPLICATIONS

This application is a divisional application of U.S. application Ser. No. 15/634,674, which was filed on Jun. 27, 2017 and it titled "ACTIVE CROSS-BAND ISOLATION FOR A TRANSFORMER-BASED POWER AMPLIFIER," and which claims priority to U.S. Provisional Application No. 62/356,137, which was filed on Jun. 29, 2016 and is titled "ACTIVE CROSS-BAND ISOLATION FOR A TRANSFORMER-BASED POWER AMPLIFIER," the disclosure of which is expressly incorporated by reference herein in its entirety for all purposes. Any and all applications, if any, for which a foreign or domestic priority claim is identified in the Application Data Sheet of the present application are hereby incorporated by reference in their entireties under 37 CFR 1.57.

BACKGROUND

Field

Embodiments of the present disclosure relate to electronic systems, and in particular, to radio frequency (RF) systems that include transformer-based power amplifiers.

Description of the Related Technology

Power amplifiers can be included in mobile devices to amplify a radio frequency (RF) signal for transmission via an antenna. For example, in mobile devices having a time division multiple access (TDMA) architecture and frequency division multiple access (FDMA), such as those found in Global System for Mobile Communications (GSM), code division multiple access (CDMA), and wideband code division multiple access (W-CDMA) systems, a power amplifier can be used to provide amplification during an assigned transmit time slot. Additionally, in mobile devices using frequency division duplexing (FDD), such as systems using long term evolution (LTE), a power amplifier can be used to provide amplification to one or more transmit carrier frequencies.

In order to meet operating specifications, power amplifiers in mobile phones and other RF devices are typically designed to generate relatively large output signals and corresponding power levels. This has historically made it difficult to integrate power amplifiers with other components.

SUMMARY

The systems, methods and devices of this disclosure each have several innovative aspects, no single one of which is solely responsible for the all of the desirable attributes disclosed herein. Details of one or more implementations of the subject matter described in this specification are set forth in the accompanying drawings and the description below.

Certain aspects of the present disclosure relate to a radio frequency device. The radio frequency device may include a first power amplifier having a first primary winding and a first secondary winding. The first power amplifier may be configured in a first transmit mode to amplify a first radio frequency transmit signal received on the first primary winding and to provide a first amplified radio frequency transmit signal on the first secondary winding. The first radio frequency transmit signal may be of a first frequency. The radio frequency device may further include a second power amplifier having a second primary winding and a second secondary winding. The second power amplifier may be configured in a second transmit mode to amplify a second radio frequency transmit signal received on the second primary winding and to provide a second amplified radio frequency transmit signal on the second secondary winding. The second radio frequency transmit signal may be of a second frequency that is a harmonic of the first frequency. Moreover, the radio frequency device may include a controller configured, when the first power amplifier is in the first transmit mode, to detune the second power amplifier to reduce power coupling between the first power amplifier and the second power amplifier.

In certain embodiments, the radio frequency device may further include a first switch coupled to a receive side of the first secondary winding and a second switch coupled to a receive side of the second secondary winding. Further, the first power amplifier and the first switch may reside together on a bulk complementary metal oxide semiconductor die. In some cases, the first switch is configured to close and the second switch is configured to open when the first power amplifier is in the first transmit mode. The first switch, in certain implementations, may include a single transistor.

For some implementations, the first power amplifier further includes a first upper core and a first lower core. The first upper core may include a pair of transistors and the first lower core may include a pair of transistors. The pair of transistors of the first upper core may alternatingly turn on and off when the first power amplifier is configured in the first transmit mode and the pair of transistors of the first lower core may alternatingly turn on and off when the first power amplifier is configured in the first transmit mode.

In some embodiments, the second power amplifier may further include a second upper core and a second lower core. The second upper core and the second lower core may each include a pair of transistors. Further, the controller may detune the second power amplifier by turning on both transistors of the pair of transistors of the second lower core when the first power amplifier is configured in the first transmit mode. With certain implementations, the second lower core further includes a capacitor configured to tune the second lower core based at least in part on the second frequency when the second power amplifier is configured in the second transmit mode. In some cases, the capacitor is shorted to ground when the controller detunes the second power amplifier. Further, the controller may turn off both transistors of the pair of transistors of the second upper core when the first power amplifier is configured in the first transmit mode.

Moreover, in certain embodiments, the controller selects the first transmit mode or the second transmit mode based at least in part on a control signal received from a baseband processor. Alternatively, or in addition, the controller may select the first transmit mode or the second transmit mode based at least in part on a control signal received from a base station. The first power amplifier may include a plurality of amplifier driver stages connected to the first primary winding. Further, the first power amplifier may be a distributed active transformer-type power amplifier. In some implementations, the geometry of the first secondary winding may generally or substantially match the geometry of the first primary winding. Thus, the first secondary winding and the first primary winding may be of the same shape. However, the size of the windings may differ enabling one winding to be nested within the other winding.

In certain embodiments, the first primary winding includes a first inner primary winding and a first outer primary winding, and the second primary winding includes a second inner primary winding and a second outer primary winding. The first inner primary winding may generally or substantially conform to an interior boundary of the first secondary winding and the first outer winding generally conforms to an exterior boundary of the first secondary winding.

Certain additional aspects of the present disclosure relate to a method of operating a wireless device. The method may include receiving an indication that the wireless device is to transmit using a first frequency. Further, the method may include turning off a secondary switch in communication with a secondary winding of a power amplifier configured to transmit signals of a second frequency. The second frequency may be a harmonic of the first frequency. Moreover, the method may include configuring a lower core of the power amplifier in an active state and configuring an upper core of the power amplifier in an inactive state.

In some embodiments, configuring the lower core of the power amplifier in an active state includes turning on a pair of transistors of the lower core. Turning on the pair of transistors of the lower core may result in shorting a capacitor connected between the pair of transistors to ground. Further, configuring the lower core of the power amplifier in an active state may detune the power amplifier. Moreover, in some cases, configuring the upper core of the power amplifier in an inactive state includes turning off a pair of transistors of the upper core.

Although certain embodiments and examples are disclosed herein, inventive subject matter extends beyond the examples in the specifically disclosed embodiments to other alternative embodiments and/or uses, and to modifications and equivalents thereof.

BRIEF DESCRIPTION OF THE DRAWINGS

FIGS. 8A-8B are schematic diagrams showing examples of power amplifier configurations including a compensation circuit to improve isolation of the receive path from the transmit path during signal transmission.

DETAILED DESCRIPTION OF EMBODIMENTS

Figure 1:
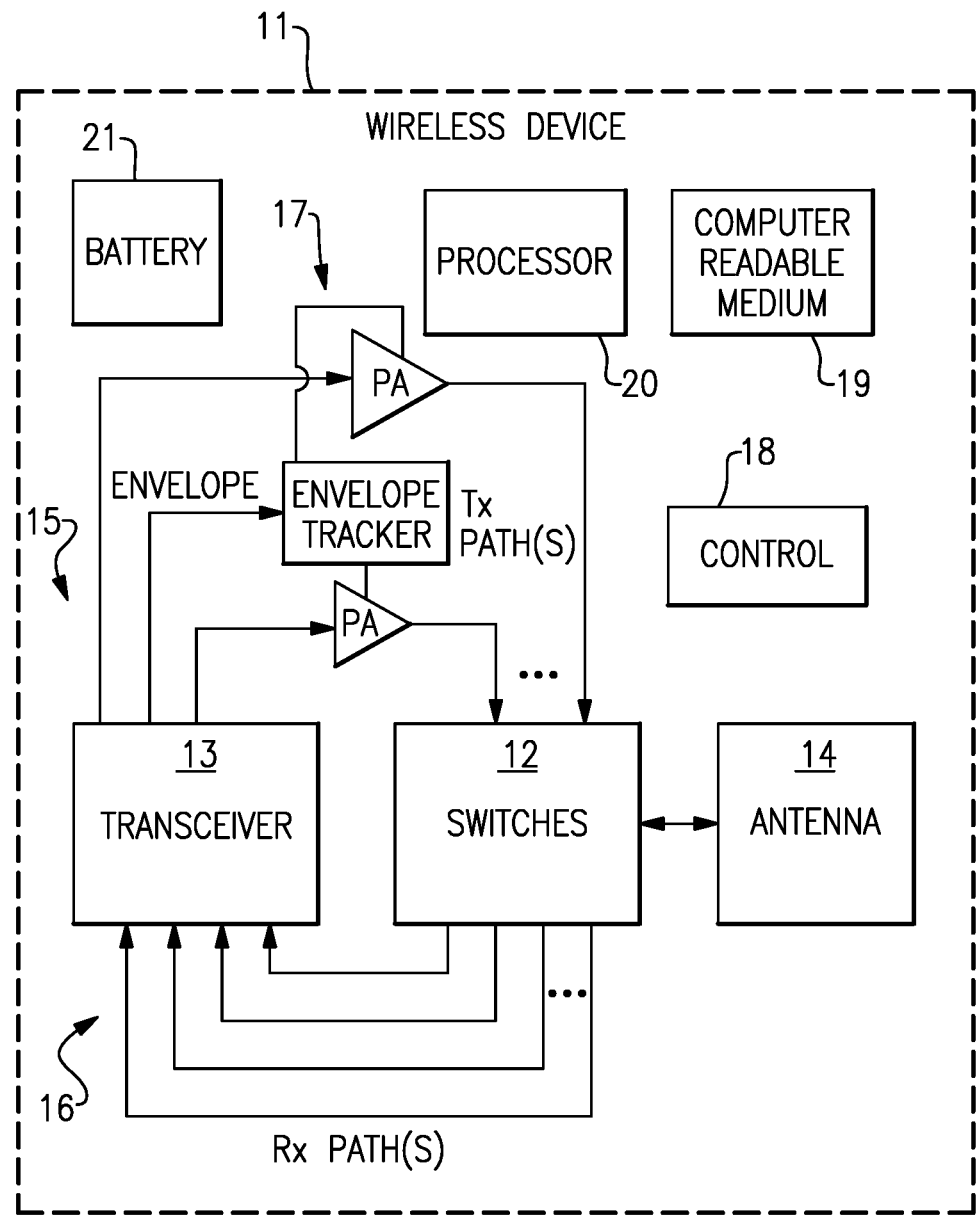
FIG. 1 is a schematic block diagram of an example of a wireless device.

The headings provided herein, if any, are for convenience only and do not necessarily affect the scope or meaning of the claimed invention.

Overview

There is a desire to reduce a power amplifier (PA) system cost by manufacturing power amplifier circuitry using complementary metal oxide semiconductor (CMOS) processing. For instance, conventional CMOS processing technology can be more cost-effective than the semiconductor-on-insulator (SOI) technology used in many existing systems. However, manufacturing a power amplifier using conventional CMOS processing can be challenging. Some designs provide poor power amplifier linearity and otherwise undesirable performance at high power levels, for example. Further, the relatively low breakdown voltage associated with CMOS technology makes the use of CMOS challenging for relatively high-power (e.g., one or two watts, or higher) PA applications. Some CMOS power amplifiers described herein incorporate a distributed active transformer (DAT) architecture, which addresses some of these challenges, providing relatively good performance and reduced costs, as compared to power amplifiers built using SOI technology, for example. For instance, DAT or other transformer-based power amplifiers can be built using bulk CMOS processing incorporating conventional substrates, e.g., instead of using SOI substrates and processing.

DAT power amplifiers can generally include a primary winding of an active transformer having a plurality of power amplifiers interconnected in a generally circular, rectangular, or other appropriate geometry. A secondary winding which can generally match the geometry of the primary winding can serve to efficiently combine the power of the individual power amplifiers. Examples of DAT transformers can be found in U.S. Pat. No. 6,737,948 ("the '948 patent"), which issued on May 18, 2004 and is titled "Distributed Circular Geometry Power Amplifier Architecture". Additional examples of DAT transformers including DAT transformers having a secondary winding disposed between two primary windings can be found in U.S. Pat. No. 7,095,283 ("the '283 patent"), which issued on Aug. 22, 2006 and is titled "Supply Circuit for Power Amplifier Drivers". The '948 and '283 patents are hereby incorporated by reference herein, and form a part of the present disclosure. In particular, the power amplifiers described in the '948 and '283 patents are compatible with and/or are components of embodiments described herein. Further, additional examples of embodiments of DAT power amplifiers that may be used with the systems described herein may be found in the following applications: U.S. application Ser. No. 14/983,318, which was filed on Dec. 29, 2015 and is titled "INTEGRATED CMOS TRANSMIT/RECEIVE SWITCH IN A RADIO FREQUENCY DEVICE," U.S. application Ser. No. 14/983,256, which was filed on Dec. 29, 2015 and is titled "IMPROVING TRANSMIT-RECEIVE ISOLATION IN A TRANSFORMER-BASED RADIO FREQUENCY POWER AMPLIFIER," and U.S. application Ser. No. 14/983,322, which was filed on Dec. 29, 2015 and is titled "DYNAMIC TUNING OF A TRANSFORMER-BASED RADIO FREQUENCY POWER AMPLIFIER," each of which is hereby incorporated by reference in its entirety.

Traditional power amplifiers and transmit/receive switches in RF front-ends are typically implemented on separate dies. As an example, power amplifiers are often implemented with hetero-junction bipolar transistors (HBTs) on a Gallium Arsenide (GaAs) die while transmit/receive switches are implemented on a separate die implementing pseudomorphic high-electron mobility transfer (pHEMT) semiconductor technology.

Certain aspects of the present disclosure achieve higher levels of integration in RF front ends through the integration of the power amplifier and the transmit/receive switch onto a single die. For instance, according to certain embodiments, a transmit/receive switch and a DAT power amplifier are integrated onto a single CMOS die (e.g., a CMOS die built using conventional silicon substrate processing). In certain embodiments a single CMOS die includes a tuned DAT-based power amplifier with a transmit/receive switch placed on a ground or receive side of a secondary winding of the DAT. In the transmit mode, the switch is active. Because it is located on the ground or receive side of the transformer, the voltage swing across the switch can be kept small and reliability issues at high voltage as well as harmonic generation concerns can be reduced. In receive mode, the switch is deactivated, and the secondary winding of the DAT can provide a low loss path to the receiver. The switch can be implemented through a single CMOS transistor (e.g., a single NMOS transistor), where a gate voltage controls whether the device is in transmit or receive mode, although more transistors could be used in other embodiments.

Where the frequency separation between the transmit and receive band is relatively small, it can be difficult to maintain isolation between the transmit and receive bands. According to certain embodiments, the transformer-based matching network of the DAT can be tuned based on whether the amplifier is in transmit or receive mode. For instance, the DAT can include a de-tuning circuit or function which in the receive mode reduces the coupling coefficient of the transformer so that the secondary of the transformer appears primarily as an inductance, reducing signal loss to the primary through coupling. In one embodiment, the system adjusts the biasing levels of the transformer to implement the detuning function.

When the RF front-end is transmitting, relatively high transmit power can leak to the receive ports, which can damage componentry including surface acoustic wave (SAW) filters and low noise amplifiers (LNAs). In order to address such challenges certain other embodiments improve transmit/receive isolation through the incorporation of an on-die compensation circuit which can include a capacitance. The compensation circuit helps to maintain power incident at the receive ports to acceptable power levels (e.g., below between +10 to +13 Decibel-milliwatts [dbm] when the power amplifier is transmitting +35 dbm), thereby avoiding or minimizing risk of damage to front-end componentry. For instance, a compensation capacitor can be placed in series in the receive path, off of the secondary winding of the DAT, to reduce swing on the receive port(s) by canceling or reducing bond-wire reactance. The capacitor can be placed in series with an integrated transmit/receive switch that is integrated with the power amplifier on a CMOS die, for example.

In some implementations, the RF front-end or front-end module (FEM) may include multiple power amplifiers enabling communication across multiple frequency bands. For example, the FEM may include a power amplifier configured to process low-band signals and a power amplifier configured to process high-band signals. Sometimes, the high-band signal will be associated with a frequency that is an integer multiple of the low-band signal. In such cases, harmonics of the low-band signal may equal the high-band signal. For instance, if the low-band signal is 900 MHz and the high-band signal is 1,800 MHz, the second harmonic of the low-band signal will equal the high-band signal.

It is often desirable to combine the low-band power amplifier and the high-band power amplifier on a single die to reduce the size and cost of components of the wireless device incorporating the PAs. Even with wireless device implementations that maintain the PAs on separate dies, it may be desirable to position the low-band power amplifier and the high-band power amplifier near to each other to reduce the length of signal paths to the antenna and/or due to the positioning of other components. A consequence of the positioning of a low-band PA near a high-band PA that is configured to process a signal that is an integer multiple of the frequency processed by the low-band PA is parasitic coupling between the PAs. This parasitic coupling can result in power leaking from one signal path to another signal path and may result in cross-band interference and/or spurious emissions.

Passive techniques may be used to reduce the cross-band interference between the low-band and high-band signal paths. These passive techniques may rely on circuit geometry, metallization techniques, and/or changes in material selection. It is often desirable to obtain harmonic isolation of around −40 dBm. However, in some cases, the passive techniques do not provide a sufficient reduction in the parasitic coupling. For example, in some cases, the ever increasing reduction in the size of devices limits the application of circuit geometry techniques. Further, some techniques for reducing cross-band interference use off-chip switches that can provide additional isolation of about −22 dBm. However, as previously discussed, there is a desire to combine elements, such as switches on the same die or module as the PAs to, for example, reduce costs. This combining of circuit elements further limits the ability to obtain the necessary reduction in parasitic coupling.

Embodiments disclosed herein implement an active solution for reducing and/or eliminating parasitic coupling and/or improving cross-band isolation between signal paths of a plurality of power amplifiers. Embodiments herein use a combination of an on-chip switch and a detuning technique for detuning the transformers of the non-transmitting PA band. For example, while the low-band PA is being used for transmitting a low-band signal, the high-band PA may be detuned. It should be understood that the opposite may also occur. Thus, when the high-band PA is active, the low-band PA may be detuned. Further, the present disclosure is not limited to a pair of PAs (e.g., low- and and high-band), but may be implemented using any number of different signal bands and corresponding PAs. For example, the present disclosure may be used with four PAs (e.g., a high-band, a first mid-band, a second mid-band, and a low-band PA).

Example Wireless Device

FIG. 1 is a schematic block diagram of an example wireless or mobile device 11. The example wireless device 11 depicted in FIG. 1 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 megahertz (MHz) (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, 22 or more radio frequency spectrum bands.

One or more features of the present disclosure can be implemented in the foregoing example modes and/or bands, and in other communication standards. For example, 802.11, 2G, 3G, 4G, LTE, and Advanced LTE are non-limiting examples of such standards. To increase data rates, the wireless device 11 can operate using complex modulated signals, such as 64 QAM signals.

In certain embodiments, the wireless device 11 can include switches 12, a transceiver 13, an antenna 14, power amplifiers 17, which can be CMOS DAT power amplifiers as will be described herein, a control component 18, a computer readable medium 19, a processor 20, a battery 21, and an envelope tracker 30.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 1 as the transceiver 13. For example, a single component can be configured to provide both transmitting and receiving functionalities. In another example, transmitting and receiving functionalities can be provided by separate components. For instance, one or more low noise amplifiers (LNAs) can be included in the RX path(s) between the switches 12 and the transceiver 13, and can be configured to amplify and otherwise condition the signal(s) received from the switches 12.

Similarly, it will be understood that various antenna functionalities associated with the transmission and receiving of RF signals can be achieved by one or more components that are collectively represented in FIG. 1 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 1, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although FIG. 1 illustrates a configuration using two transmission paths 15 and two power amplifiers 17, the wireless device 11 can be adapted to include more or fewer transmission paths 15 and/or more or fewer power amplifiers 17.

In FIG. 1, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although FIG. 1 illustrates a configuration using four receiving paths 16, the wireless device 11 can be adapted to include more or fewer receiving paths 16.

To facilitate switching between receive and transmit paths, the switches 12 can be configured to electrically connect the antenna 14 to a selected transmit or receive path. Thus, the switches 12 can include a number of switches and associated componentry configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 1 shows that in certain embodiments, a control component 18 can be provided for controlling various control functionalities associated with operations of the switches 12, the power amplifiers 17, the envelope tracker 30, and/or other operating components.

In certain embodiments, a processor 20 can be configured to facilitate implementation of various processes described herein. The processor 20 can implement various computer program instructions. The processor 20 can be a general purpose computer, special purpose computer, or other programmable data processing apparatus.

In certain embodiments, these computer program instructions may also be stored in a computer-readable memory 19 that can direct the processor 20 to operate in a particular manner.

The illustrated wireless device 11 also includes an envelope tracker 30, although other types of power controllers can be used in other embodiments, which can be used to provide power amplifier supply voltages to one or more of the power amplifiers 17. For example, the envelope tracker 30 can be configured to change the supply voltages provided to the power amplifiers 17 based upon an envelope of the RF signal to be amplified. In the illustrated implementation, the envelope signal is provided to the envelope tracker 30 from the transceiver 13. However, other implementations are possible, including, for example, configurations in which the envelope signal is provided to the envelope tracker 30 from a baseband processor or a power management integrated circuit (PMIC). Furthermore, in certain implementations, the envelope signal can be generated from the RF signal by detecting the RF signal's envelope using any suitable envelope detector.

The envelope tracker 30 can be electrically connected to the battery 21, which can be any suitable battery for use in the wireless device 11, including, for example, a lithium-ion battery. As will be described in detail further below, by controlling the voltage provided to one or more of the power amplifiers 17, the power consumed from the battery 21 can be reduced, thereby improving the battery life of the wireless device 11. In certain configurations, the power amplifiers 17 can be implemented using CMOS processing, which can lower cost and/or enhance integration. However, other configurations of the power amplifiers 17 are possible. For example, the power amplifiers 17 can be implemented using III-V semiconductor processing, such as Gallium Arsenide (GaAs) processing.

In certain configurations, the wireless device 11 may operate using carrier aggregation. Carrier aggregation can be used for both Frequency Division Duplexing (FDD) and Time Division Duplexing (TDD), and may be used to aggregate a plurality of carriers or channels, for instance up to five carriers. Carrier aggregation includes contiguous aggregation, in which carriers within the same operating frequency band are aggregated. Carrier aggregation can also be non-contiguous, and can include carriers separated in frequency within a common band or in different bands.

Example Switches-Block

Figure 2:
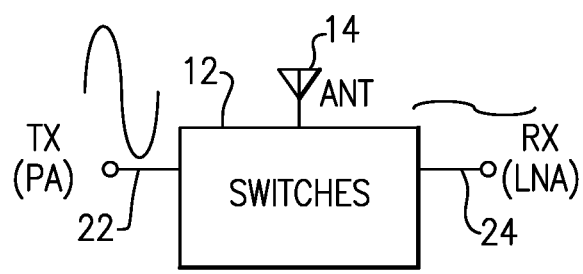
FIG. 2 is a schematic diagram of a transmit/receive switch that can be included in the wireless device of FIG. 1, and that can be integrated together on the same die as one or more power amplifiers.

FIG. 2 illustrates a simplified diagram of the switches block 12 and the antenna 14. As represented by the large and small waveforms, when the wireless device 11 is in a transmit mode, the switches 12 direct a transmit signal received on a transmit port 22 of the switches block from the power amplifier 17 to the antenna 14 for wireless transmission, while it is desirable to block all or substantially all of the transmit signal from leaking into the receive path. While not shown, in a receive mode, the switches 12 are configured to pass a signal received from the antenna to a receive port 24 of the switches block 12, for eventual delivery low noise amplifier (LNA) or other appropriate component in the receive path.

In some existing systems, the switching function is implemented by an SOI transistor network, such as a silicon-on-insulator transistor network. However, because of the large voltage swings of the signal provided by the power amplifiers 17, a relatively large number of transistors are often connected in series to avoid breakdown issues. For instance, in some such systems the switches are often implemented using a number of series-connected transistors implemented in an SOI die that is separate from a die that includes the power amplifiers 17. This can increase costs and series connected transistors can increase series resistance losses and capacitive loss to the substrate.

Example Die Combining a Switch and DAT-Based PA

Figure 3:
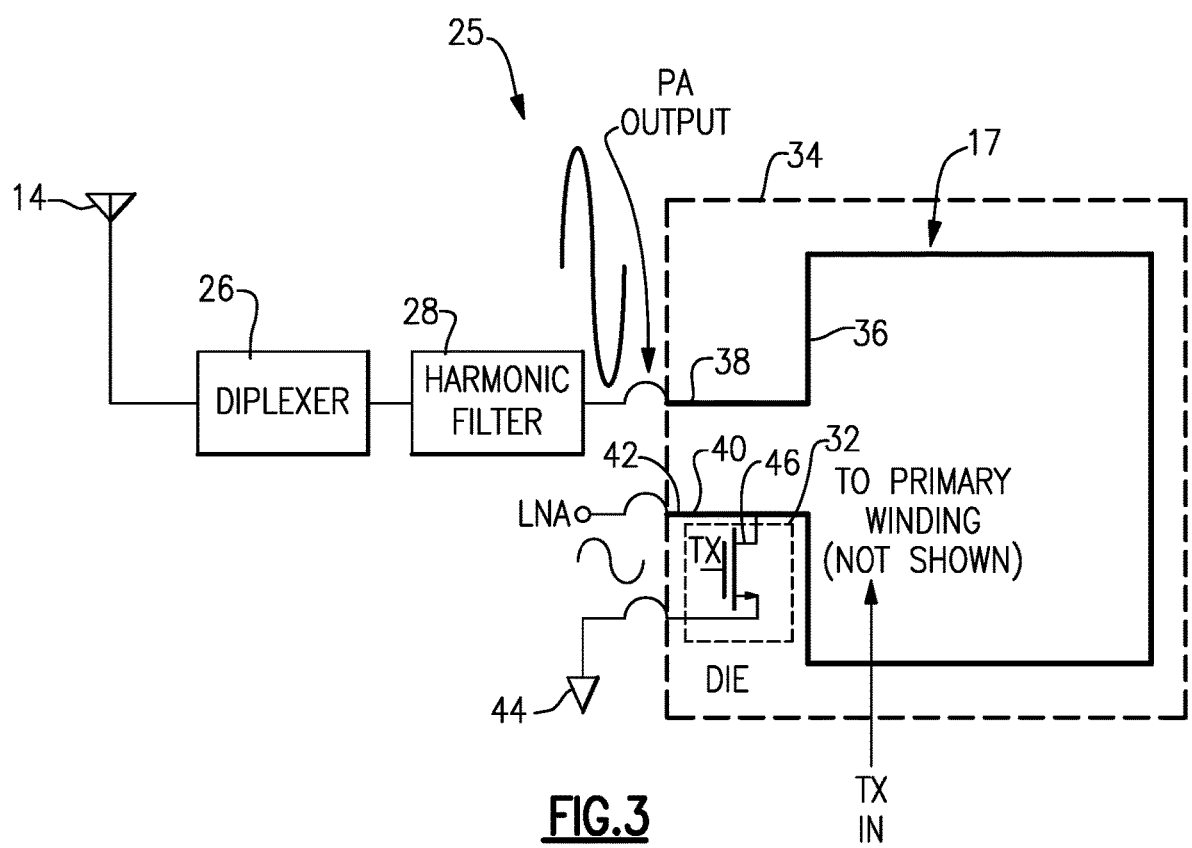
FIG. 3 is a schematic diagram of a portion of a wireless device including a distributed active transformer (DAT) power amplifier integrated onto a single die with a transmit/receive switch.

In order to address some of the above-described issues, certain embodiments described herein by connect a transmit/receive switch to a secondary winding of a DAT-based power amplifier 17. FIG. 3 depicts a portion 25 of a wireless device showing an antenna 14, diplexer 26, harmonic filter 28, DAT-based power amplifier 17, and transmit/receive switch 32. As shown, the power amplifier 17 and transmit/receive switch 32 are integrated together on a single die 34, which can be a CMOS die, for example. While shown as a single switch for the purposes of illustration, the transmit/receive switch 32 can form some or all of the switches in the switches block 12 of the wireless device 11 of FIG. 1.

Although shown for the purposes of simplicity as having a single input and output port, the diplexer 26 can include multiple output ports connected to the harmonic filter 28 each dedicated to a particular frequency band. In a receive mode, the diplexer 26 can be configured to receive a signal from the antenna 14, extract frequency bands from the signal and provide on the appropriate output port. For instance, the diplexer 26 can include a first filter configured to pass a first frequency band of the receive signal to a first output port and a second filter configured to pass a second frequency band of the receive signal to a second output port. In a transmit mode, the diplexer 26 can be configured to pass a transmit signal received from an active transmit frequency band and output the signal to the antenna 14.

The harmonic filter 28 can be configured to suppress undesired harmonic in the transmit signal, depending on whether the device 11 is in a transmit or receive mode.

The power amplifier 17 in the illustrated embodiment is a DAT-based power amplifier. The power amplifier 17 includes a primary winding (not shown) and a secondary winding 36 of a transformer. As shown, the harmonic filter 28 is coupled to an antenna side or antenna end 38 of the secondary winding 36 of the DAT-based power amplifier 17, which forms an output of the power amplifier 17. For instance, the harmonic filter 28 may connect to the antenna side 38 of the secondary winding 36 through a bond-wire of the die 34.

As shown, when the device 11 is in transmit mode, a transmit input signal (TX IN) is provided to the primary winding of the power amplifier 17. The power amplifier 17 amplifies the input signal via an inductive transformer function and outputs an amplified version of the transmit signal on the antenna side 38 of the secondary winding 36. The transmit signal is passed to the harmonic filter 28, for eventual transmission via the antenna 14. As represented by the depiction of the relatively large wave form, relatively large voltage swings can be present on the output of the power amplifier 17 when the device 11 is in transmit mode.

As shown, a receive side or receive end of the secondary winding 36 couples to a receive port of the die 34. When the device 11 is in receive mode, signals received via the antenna 14 are processed by the diplexer 26 and harmonic filter 28, and communicated from the antenna side 38 of the secondary winding 36 to the receive side 40 of the secondary winding 36. The signal is transmitted off of the die 34 via a receive port 42, such as to an LNA and then to the transceiver 13 for subsequent processing.

The die 34 includes the transmit/receive switch 32 between the receive side 40 of the secondary winding 36 of the power amplifier 17 and reference voltage or ground 44. The transmit/receive switch 32 is formed by a single transistor 46, which in the illustrated embodiment is an nMOS field effect transistor (FET). However, more transistors and/or transistor(s) of different varieties can be used. In transmit mode, a voltage signal above a threshold voltage of the transistor 46 is applied to the gate of the transistor 46, thereby placing the transistor 46 in an 'on' state. This creates a low impedance path from the receive side 40 of the secondary winding 36 to ground 44. As a result there is relatively little signal swing seen by the receive port 42 of the die 34 and subsequent components in the receive path such as the LNA, as illustrated by the graphical depiction of a relatively small waveform at the receive port 42. In this manner, the switch 32 isolates and protects the LNA and other components in the receive path from damage when the device 11 is transmitting. In receive mode, on the other hand, a voltage signal below threshold of the transistor 46 is applied to the gate of the transistor 46, and the transistor 46 is in an 'off' state, creating high impedance path from the secondary winding 36 to ground, and thus allowing low loss transmission of the receive signal via the receive port 42.

Connecting the transmit/receive switch 32 to the receive side 40 of the secondary winding 36 of the power amplifier 17 in the illustrated manner enables integration of the transmit/receive switch 32 with the power amplifier 17 on a single CMOS die 34. The switch provides sufficient isolation between the transmit and receive paths, protecting downstream componentry in the receive path such as an LNA.

Example Integrated Transformer-Based PAs

Figure 4:
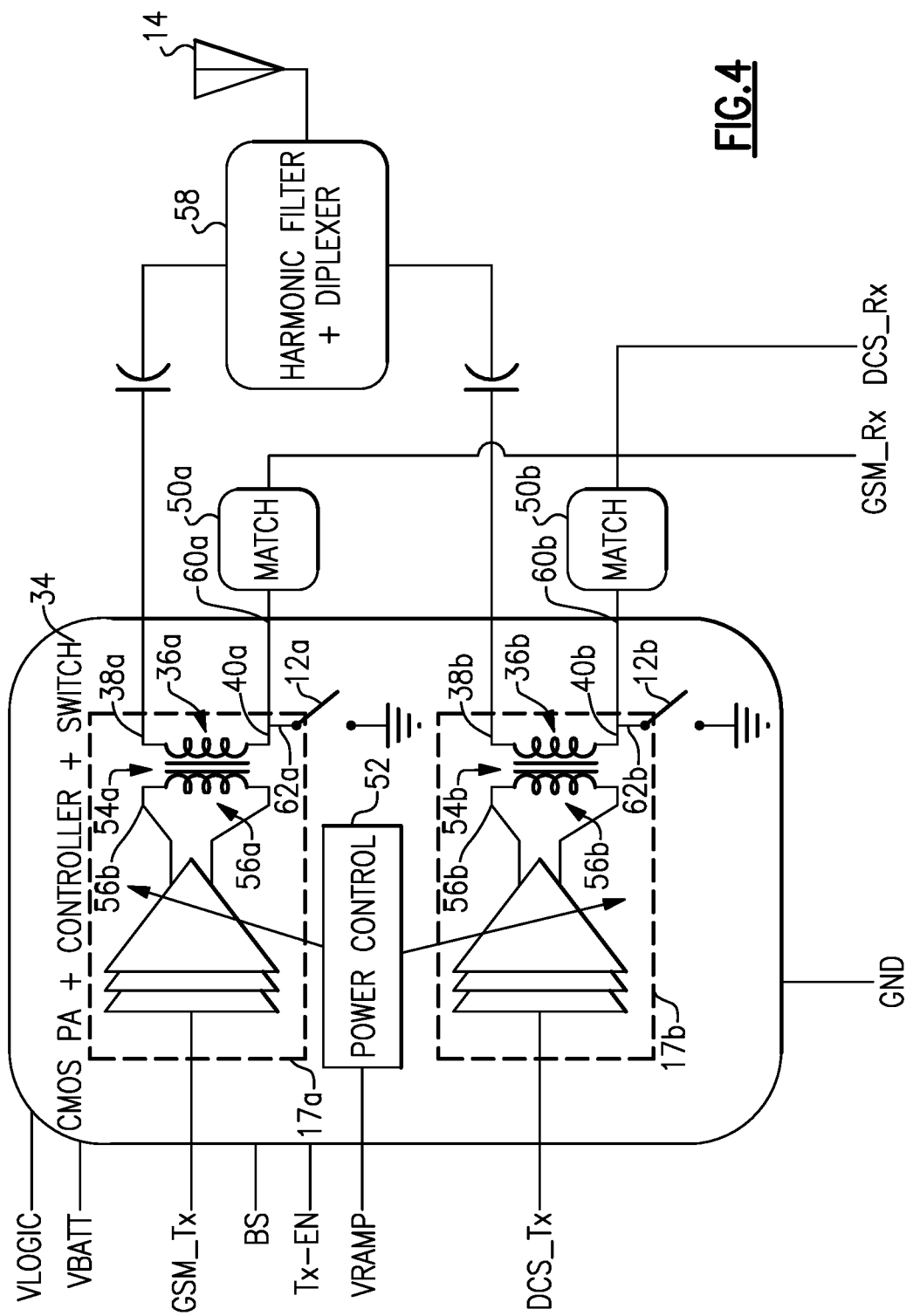
FIG. 4 is a schematic diagram of an embodiment of a portion of a wireless device having transformer-based power amplifiers integrated together with transmit/receive switches on a complementary metal oxide semiconductor (CMOS) die.

FIG. 4 is a schematic diagram of an embodiment of a portion of a wireless device having transformer-based power amplifiers integrated together with transmit/receive switches on a single semiconductor die 34, which is a CMOS die in the illustrated embodiment.

The wireless device can support multiple frequency bands, and includes separate paths each including a set of corresponding power amplifiers and transmit/receive switches.

For instance, in the illustrated embodiment, a first path supports a Global System for Mobile Communications (GSM) band, and includes corresponding power amplifier(s) 17a, transmit/receive switch(es) 12a, and matching circuitry 50a. The first path may use frequencies associated with any GSM band, including GSM-850, GSM-900, GSM-1900, or the like.

A second path supports a different frequency band than the first path, which is the Digital Cellular Service (DCS) band in the illustrated configuration, and includes corresponding power amplifier(s) 17b, transmit/receive switch(es) 12b, and matching circuitry 50b. The second path may use frequencies that correspond to the DCS band, which may be the same as the GSM-1800 band.

A power control block 52 resides on the die 34 and controls power delivery to the power amplifiers 17a, 17b. For instance, the power control block 52 in one embodiment implements an envelope tracking function, although other types of power control are possible, including average power tracking (APT), for example.

The power amplifiers 17a, 17b in the first and second paths receive and amplify corresponding transmit signals. In the illustrated embodiment, the power amplifiers 17a, 17a are DAT type power amplifiers, as represented by the transformers 54a, 54b. The amplified signal is transferred from the primary coil 56a, 56b of each power amplifier 17a, 17b to the secondary coil 36a, 36b of each power amplifier 17a, 17b. In particular, componentry 58 which can include one or more harmonic filters and/or diplexers is coupled to the antenna side 38a, 38b of the secondary coil 36a, 36b of each of power amplifier 17a, 17b. The componentry 58 is positioned between the power amplifiers 17a, 17b and an antenna 14, and when the wireless device is in transmit mode, the componentry 58 processes the transmit signal(s) and forwards the processed transmit signal(s) to the antenna for wireless transmission.

As shown, the transmit/receive switches 12a, 12b are positioned to be in a path to ground between nodes 62a, 62b. Each of the nodes 62a, 62b is electrically coupled to a receive side of the 40a, 40b of the secondary coil 36a, 36b of the corresponding power amplifier 17a, 17b, and a receive port 60a, 60b of the die 34.

In the transmit mode, the transmit/receive switches 12a, 12b for each path are closed, creating a low impedance path from the nodes 62a, 62b to ground, and thereby isolating the receive ports 60a, 60b from leakage of the relatively large transmit signal to the receive side 40a, 40b of the secondary coils 36a, 36b of the corresponding power amplifiers 17a, 17b.

On the other hand, in the receive mode, the transmit/receive switches 12a, 12b are opened, thereby creating a high impedance path from the nodes 62a, 62b to ground. In such cases, receive signals detected by the antenna 14 are forwarded to the componentry 58 for processing. The componentry 58 passes the processed receive signals to the secondary coils 36a, 36b of the respective power amplifiers 17a, 17b of each path. In particular, the receive signals pass from the antenna side 38a, 38b to the receive side 40a, 40b of the secondary winding 36a, 36b of the respective power amplifier 17a, 17b. Because, the receive switches 12a, 12b are opened, each receive signal passes to the receive port 60a, 60b of the corresponding path for transmission off of the die 34. The receive signals are then processed by the matching circuitry 50a, 50b before being forwarded to downstream componentry in the receive path such as an LNA and transceiver. The matching circuitry 50a, 50b can be configured to transform the impedances presented to the receive ports 60a, 60b into a desired impedance level, such as 50 ohms.

The control signal for turning the switches 12a, 12b on and off may be derived from the illustrated "Tx_EN" signal, which may be forwarded to the die 34 from an off-die processor of the wireless device, such as the processor 20 of the wireless device 11 shown in FIG. 1, or any other appropriate source.

Example DAT Power Amplifier

Figure 5:
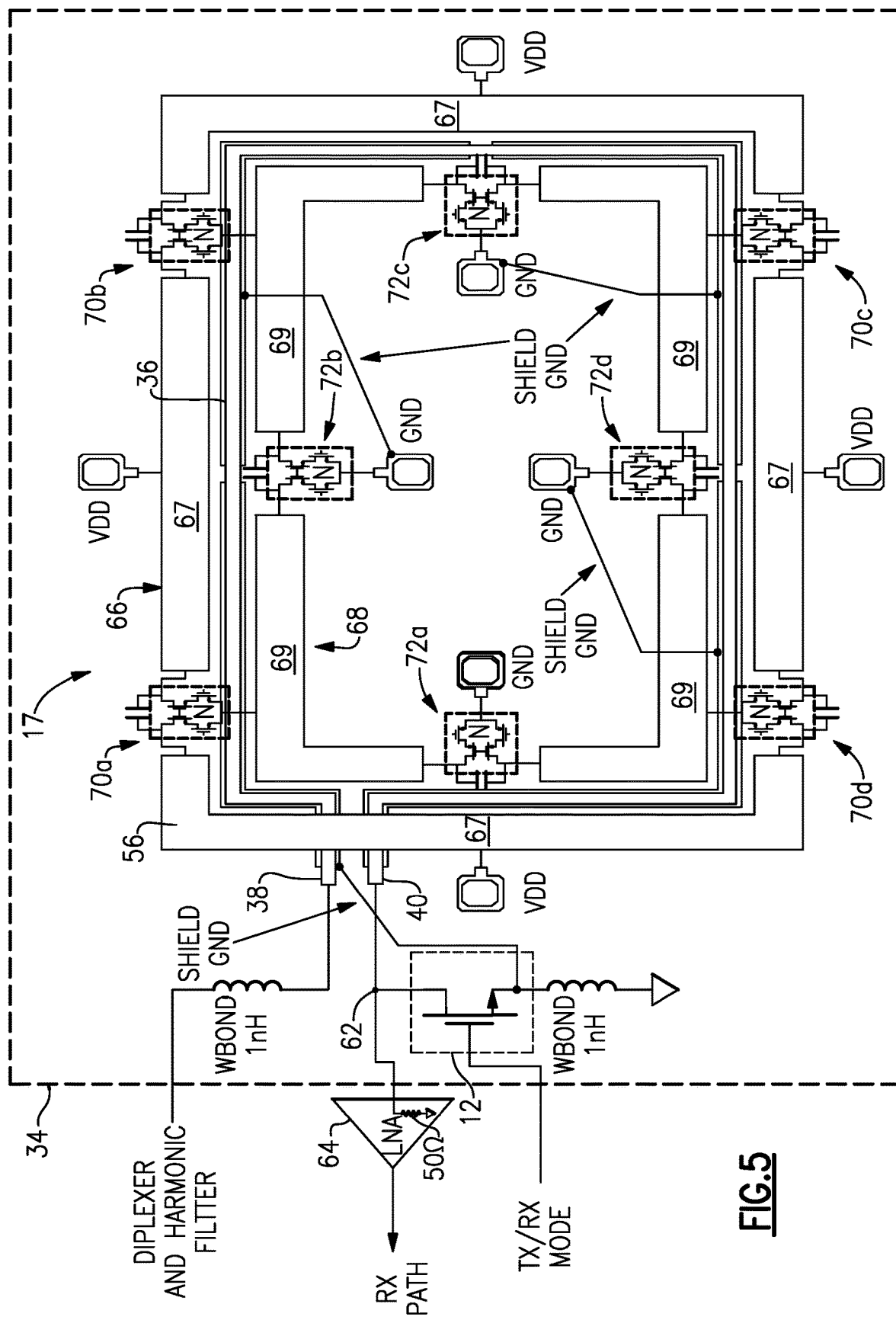
FIG. 5 is a schematic diagram showing another embodiment of a DAT power amplifier connected to a transmit/receive switch.

FIG. 5 is a schematic diagram showing another embodiment of a DAT power amplifier 17 connected to a transmit/receive switch 12, which may be integrated together on a die 34, which is a CMOS die in the illustrated embodiment. In the illustrated embodiment, the switch 12 is connected to a node 62, which is connected to receive side 40 of a secondary winding 36 of the power amplifier 17a and an input of an LNA 64. In particular, the switch 12 is positioned in a path between the node 62 and ground. An antenna side 38 of the secondary winding 36 is coupled to a diplexer and harmonic filter which are positioned between the antenna side 38 and an antenna (not shown). The power amplifier 17 also includes a primary winding 56. Although not shown in FIG. 5, a transmit input signal is connected to an input of the primary winding 56, which is amplified via the transform function implemented by the power amplifier 17. In a transmit mode, the amplified transmit signal is output to the antenna side 38 of the secondary winding 36, while the transmit receive switch is turned on, creating a low impedance path from the node 62 to ground, isolating the LNA 64 from transmit signal leakage onto the receive side 40 of the secondary winding 36.

As shown, the secondary coil 36 can be designed to generally match the geometry of the primary winding 56. The primary winding 56 may serve as an active winding, and includes an outer primary winding 66 formed from a plurality of inductive elements 67 and an inner primary winding 68 formed from a plurality of inductive elements 69. A plurality of amplifier stages 70a-70d are interposed between and connected to corresponding inductive elements 67 of the outer primary winding 66. A plurality of amplifier stages 72a-72d are interposed between and connected to corresponding inductive elements 69 of the inner primary winding 68. The magnetic coupling between the inductive elements 67 of the outer primary winding 66 and the inductive elements 69 of the inner primary winding 69 to the secondary winding 36 and the loop currents determine the amplified output of the secondary winding 36, thereby combining the outputs of the amplifier stages 70a-70d, 72a-72d.

While FIG. 5 shows one example of a power amplifier design, a wide variety of power amplifier designs are possible that are compatible with the embodiments described herein, including those described in the '948 and '283 patents.

Example Biasing Configuration

Figure 6:
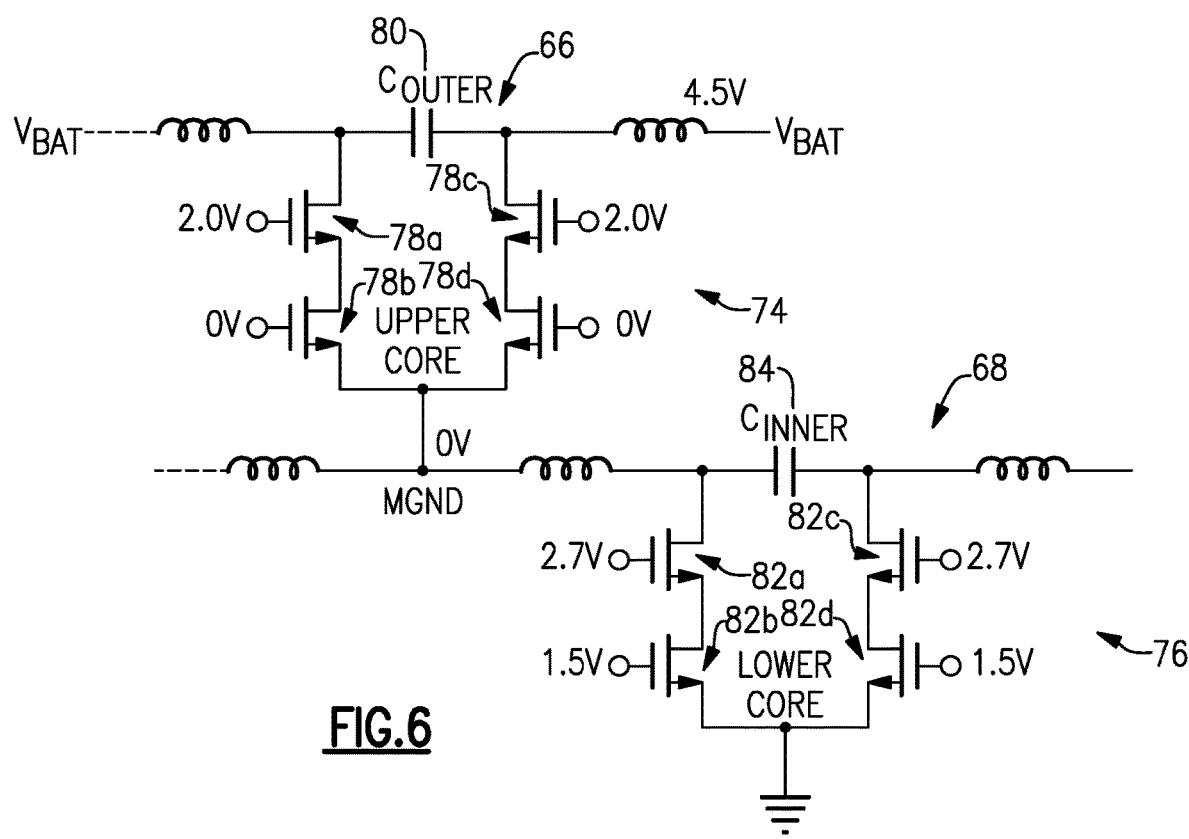
FIG. 6 is a schematic diagram illustrating an example biasing configuration for a DAT power amplifier.

FIG. 6 is a schematic diagram illustrating an example biasing configuration for a DAT power amplifier. An outer amplifying stage 74 including an upper core, which may also be referred to as an upper switching core, is coupled to a power supply (V bat) via the outer primary winding 66. An inner amplifying stage 76 including a lower core, which may also be referred to as a lower switching core, is coupled to the outer amplifying stage 74 via an inner primary winding 68.

In the illustrated embodiment, the outer amplifier stage 74 includes four field effect transistors 78a-78d. A first pair 78a, 78b of the four transistors are connected in a first cascode configuration and the second pair 78c, 78d of the two transistors are connected in a second cascode configuration. A first end of the first cascode configuration is connected to a first end of the second cascode configuration via a first tuning capacitance 80, while a second end of the first cascode configuration and a second end of the second cascode configuration share a common connection to the inner primary winding 68.

The inner amplifier stage 76 includes four field effect transistors 82a-82d. A first pair 82a, 82b of the four transistors are connected in a first cascode configuration and the second pair 82c, 82d of the two transistors are connected in a second cascode configuration. A first end of the first cascode configuration is connected to a first end of the second cascode configuration via a second tuning capacitance 84, while a second end of the first cascode configuration and a second end of the second cascode configuration are connected to ground.

While only a single outer amplifying stage 74 and inner amplifying stage 76 are shown for the purposes of illustration, additional amplifying stages having the same or similar configuration are included in the power amplifier, as indicated by the dashed lines. For instance, the amplifier stages 74, 76 may be amplifier stages of a power amplifier 17 similar to the one shown in FIG. 5.

Along these lines, a transmit receive switch may be connected to a receive side of a secondary winding (not shown) of a power amplifier including the outer and inner amplifying stages 74, 76 shown in FIG. 6 in a manner similar to the configuration shown in FIG. 5. In such cases, it can be important to limit the amount of power that is transferred between the primary winding 56 to the secondary winding 36 when the wireless device is in receive mode. For instance, a DAT power amplifier can exhibit a relatively broad-band match, where the frequency separation between the receive and transmit sub-bands is small. In receive mode, the inner and outer primary windings of the DAT may in some cases resonate with the secondary, leading to poor receive/transmit isolation and insertion loss.

In order to counteract such effects, certain configurations provide detuning of the DAT in receive mode using a control circuit that is disabled in receive mode. For instance, the circuit can control the DAT in order to detune the primary and secondary windings 36, 56 with respect to one another during receive mode, such that the primary and secondary windings 36, 56 are configured to have quite different center frequencies during receive mode. This is in contrast to transmit mode, where the primary and secondary windings 36, 56 are configured to have similar center frequencies, thereby improving the gain of the power amplifier.

FIG. 6 shows one exemplary biasing configuration that is implemented during receive mode to detune the primary and secondary windings with respect to one another. As shown, values of 2.0, 0, 2.0, and 0 volts are respectfully applied to the four transistors 78a, 78b, 78c, 78d of the outer amplifier stage 74. The four transistors of the illustrated embodiment are N-type metal-oxide semiconductor field-effect transistors (MOSFETs) having threshold voltages of around 0.4 volts, although different transistor types and/or threshold voltages are possible. As will be appreciated, similar values may be applied to additional amplifier stages associated with the outer winding 74 not explicitly shown in FIG. 6. Values of 2.7, 1.5, 2.7, and 1.5 volts are respectfully applied to the four transistors 82a, 82b, 82c, 82d of the inner amplifier stage 76. The four transistors of the illustrated embodiment are N-type metal-oxide semiconductor field-effect transistors (MOSFETs) having threshold voltages of around 0.4 volts, although different transistor types and/or threshold voltages are possible. As will be appreciated, similar values may be applied to additional amplifier stages associated with the inner winding 76 not explicitly shown in FIG. 6.

Adjusting the bias levels in the manner shown in FIG. 6 modifies the overall tuning capacitance of the outer and inner primary windings 74, 76, thereby providing the desired detuning with the secondary winding 36. For instance, according to one embodiment, the bias configuration shown in FIG. 6 results in the transistors 78a, 78b, 78c, 78d of the outer amplifier stage 74 being turned off, while the transistors 82a, 82b, 82c, 82d of the inner amplifier stage 76 are turned on. The resulting capacitances of the transistors 78a, 78b, 78c, 78d of the outer amplifier 74 in the off state are in parallel with the tuning capacitor 80 of the outer primary winding 66. On the other hand, the resistances of the transistors 82a, 82b, 82c, 82d of the inner amplifier stage 76 being in the on state acts to short out the tuning capacitor 84 of the inner primary winding 68. The bias configuration shown in FIG. 6 can be used in a receive mode, for example, such as where a controller or control circuit of a wireless device 11 including the power amplifier generates the bias control signals in response to the device 11 being placed in a receive mode. By biasing the outer and inner amplifier stages 74, 76 in the manner shown in FIG. 6, the primary and secondary windings 36, 56 are detuned with respect to one another and have divergent center frequencies. In particular, the illustrated biasing configuration results in a reduction in the coupling coefficient of the transformer so that the secondary winding 36 of the transformer appears primarily as an inductance, reducing signal loss to the primary winding 56 through coupling.

According to some embodiments, switches could be placed across or in series with the inner and outer tuning capacitors 80, 84 to provide the desired detuning function. However, such switches may enter breakdown during transmit due to the large swings on the primary windings 74, 76. Thus, modifying the tuning capacitance by adjusting the gates of the transistors 78a-78d, 82a-82d in the DAT amplifier stages 74, 76 advantageously provides the desired detuning while preventing breakdown or circuit damage.

While not shown in FIG. 6, in a transmit mode, the voltages applied to the transistors would be different, and in the transmit mode the center frequencies of the primary and secondary windings can be significantly more aligned than in the receive mode, such as in a receive mode where the biasing is done in the manner set forth in FIG. 6. When in a transmit mode, the upper and lower cores can be configured to adjust the energy supplied to the primary windings 56 based on the signal to be transmitted. This energy can be coupled to the secondary winding 38 enabling transmission of a signal from the antenna connected to the secondary winding 38.

Graphical Illustration of PA Detuning

Figure 7:
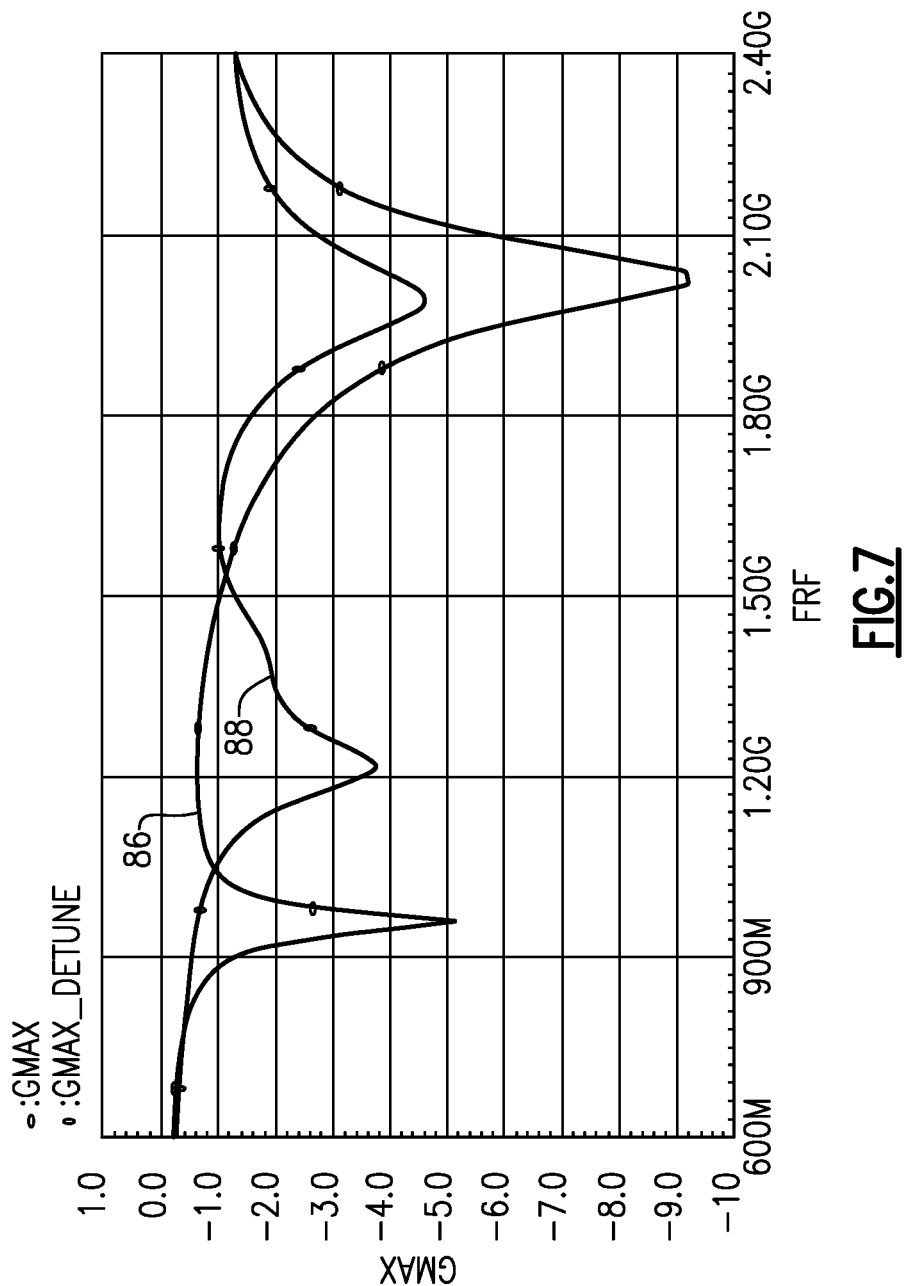
FIG. 7 is a graph that shows the detuning of the primary and secondary windings achieved by the biasing configuration shown in FIG. 6.

FIG. 7 is a graph that shows the detuning of the primary and secondary windings 36, 56 achieved by the biasing configuration shown in FIG. 6. In particular, plots 86, 88 show output characteristics of the power amplifier 17 without the biasing/detuning configuration shown in FIG. 6 (plot 86) and with the biasing/detuning configuration shown in FIG. 6 (plot 88). As shown, without the biasing/detuning configuration (plot 86), there is a sharp notch in the power amplifier output at about 1 GHz, which can result in significant receive loss at about 850 MHz. With the biasing/detuning configuration of FIG. 6 (plot 88), on the other hand, a notch appears at a higher frequency of about 1.2 GHz, resulting in receive loss at about 850 MHz being improved by more than about 0.5 dB as compared to without the biasing/detuning configuration (plot 88). The output characteristic can be a maximum gain (GMAX) of the power amplifier, for example.

Referring again to FIG. 3 for the purposes of illustration, there can be large voltage swings at the receive port 42 due to the relatively large transmit signal swings present on the primary winding and transferred to the secondary winding 36 when the power amplifier 17 is operating in transmit mode. In particular, a bond wire between the switch 32 and ground 44 acts as an inductor at high frequencies, creating a high impedance. The combination of this high impedance and the high current levels present during transmit mode result in high voltage level, which can lead to undesirable amounts of leakage power in some cases.

Example PAs with Compensation Circuit

FIGS. 8A-8B are schematic diagrams showing examples of power amplifier configurations including a compensation circuit 90 configured to reduce leakage power. Referring first to FIG. 8A, the configuration includes a DAT power amplifier 17 including an amplifier stage 70 associated with and connected to an outer primary winding 66, which is in turn coupled to a power source (VBAT). The power amplifier 17 further includes an amplifier stage 72 associated with and connected to an inner primary winding 68, which is in turn coupled to ground via a first bond wire 92. As shown, the inner primary winding 72 is also connected to the amplifier stage 70 associated with the outer primary winding 66. An antenna side 38 of a secondary winding 36 of the power amplifier 17 is connected via a second bond wire 94 to a first port 96, which may be a port of a die 34, which is a CMOS die in the illustrated embodiment, on which the componentry shown in FIG. 8A resides. The first port 96 may be connected to an antenna, for example, via intermediate componentry (not shown) which can include harmonic filters and/or diplexers as described herein. A receive side 40 of the secondary winding 36 is coupled to a second port 98 via a third bond wire 100. The second port may be a receive port of a CMOS die, for example, and may be connected to an LNA or other componentry in the receive path of the wireless device. The receive side 40 of the secondary winding 36 may also be coupled to a transmit/receive switch 12, which is connected in a path to ground along with a fourth bond wire 102 and a compensation circuit 90. The wireless device may turn the switch 12 on in a transmit mode and off in a receive mode in order to isolate the receive port 98 from the transmit path in a receive mode, as described herein.

The compensation circuit 90 includes a single capacitor in series with the switch 12 and bond wire 102 in the illustrated embodiment. As indicated previously, the compensation circuit 90 serves to reduce leakage power. Specifically, inclusion of the compensation circuit 90 acts to reduce impedance in the path between the switch 12 and ground during transmit mode. For instance, the capacitor 104 cancels the reactance of the bond wire 102, reducing voltage swing on the receive port 98.

During receive mode, it can be desirable for the wireless device to maintain similar behavior in the presence of the compensation circuit 90 as for configurations that do not include the compensation circuit 90. Thus, the compensation capacitor 104 can be selected to have a capacitance that is greater than or equal to the effective capacitance of the switch 12 when the switch 12 is in an off state during receive mode. In this manner, the compensation circuit 90 can have minimal impact on the receive signal that is output on the receive port 98 in receive mode.

In the illustrated embodiment, the capacitor has a capacitance of about 14 picofarads (PF) and the inductance of the bond wire during transmit mode is about 0.5 nanohenry for transmit frequencies of 850 MHz. In other embodiments, the compensation circuit 90 can have a different capacitance and can include additional capacitors and/or different componentry.

While only a single outer winding amplifier stage 70 and a single inner winding amplifier stage 72 are shown in FIG. 8A, it will be appreciated that additional amplifier stages may be present. As one example, the power amplifier 17 shown in FIG. 8A may form a portion of the power amplifier 17 shown in FIG. 5, and there may be a total of four additional outer winding amplifier stages 70 and four additional outer winding amplifier stages 72 arranged in the manner shown in FIG. 5.

FIG. 8B shows an alternative configuration where the order of the compensation circuit 90 and the bond wire 102 are switched in the path from the switch 12 to ground. For instance, in such a case, the compensation circuit 90 may be implemented on the same die as the power amplifier 17 and/or transmit/receive switch 17, thereby reducing costs.

Graph Illustrating Transmit/Receive Isolation

Figure 9:
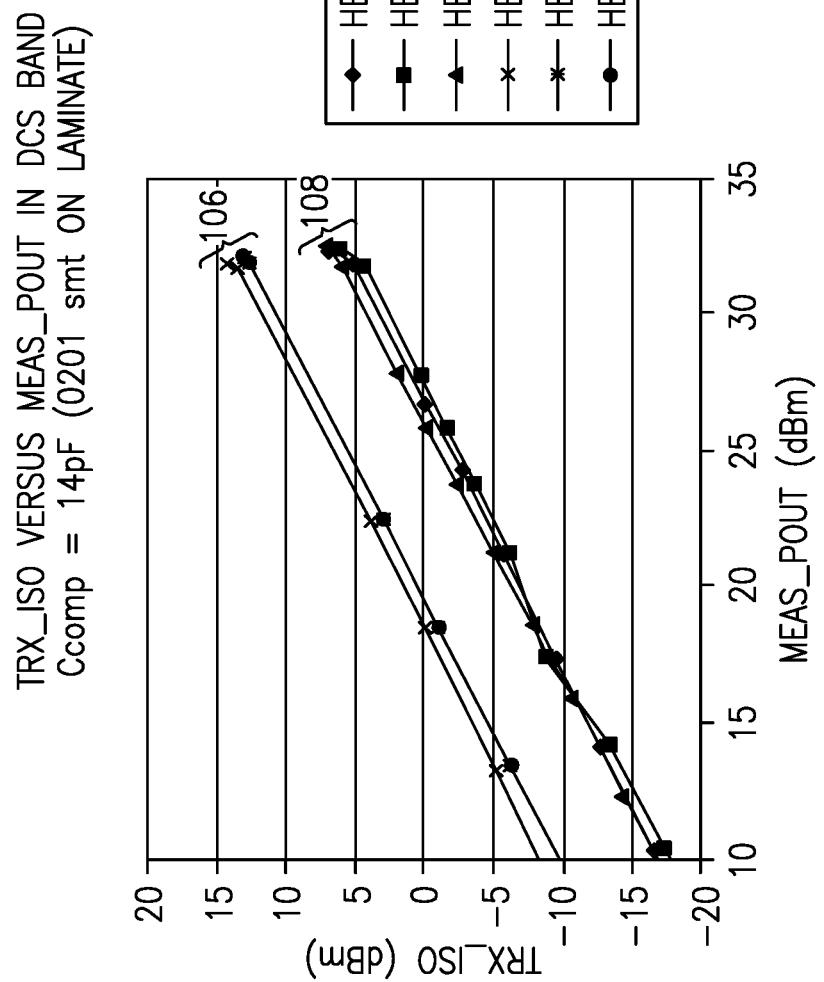
FIG. 9 is a graph showing transmit/receive isolation of a wireless device including the power amplifier configuration of FIGS. 8A-8B, with and without the compensation circuit.

FIG. 9 is a graph depicting transmit/receive isolation for configurations with and without a compensation circuit 90. For instance, the group of three plots 106 shows transmit/receive isolation for a wireless device similar to the FIGS. 8A-8B that does not include a compensation circuit 90, for frequencies of 1710, 1750, and 1785 MHz. Specifically, referring to FIG. 8A, the plots 106 shows the relative amount of transmit power leaking to the receive port 98 in Decibel-milliwatts (dBm) for different transmit powers measured on the first port 96. On the other hand, the group of three plots 108 shows transmit/receive isolation for a wireless device similar to the FIGS. 8A-8B with a compensation circuit 90 including a single 14 pF capacitor 104, also for frequencies of 1710, 1750, and 1785 MHz. As shown, inclusion of the compensation circuit 90 improves by transmit receive isolation by greater than about 5 dBm.

Figure 10:
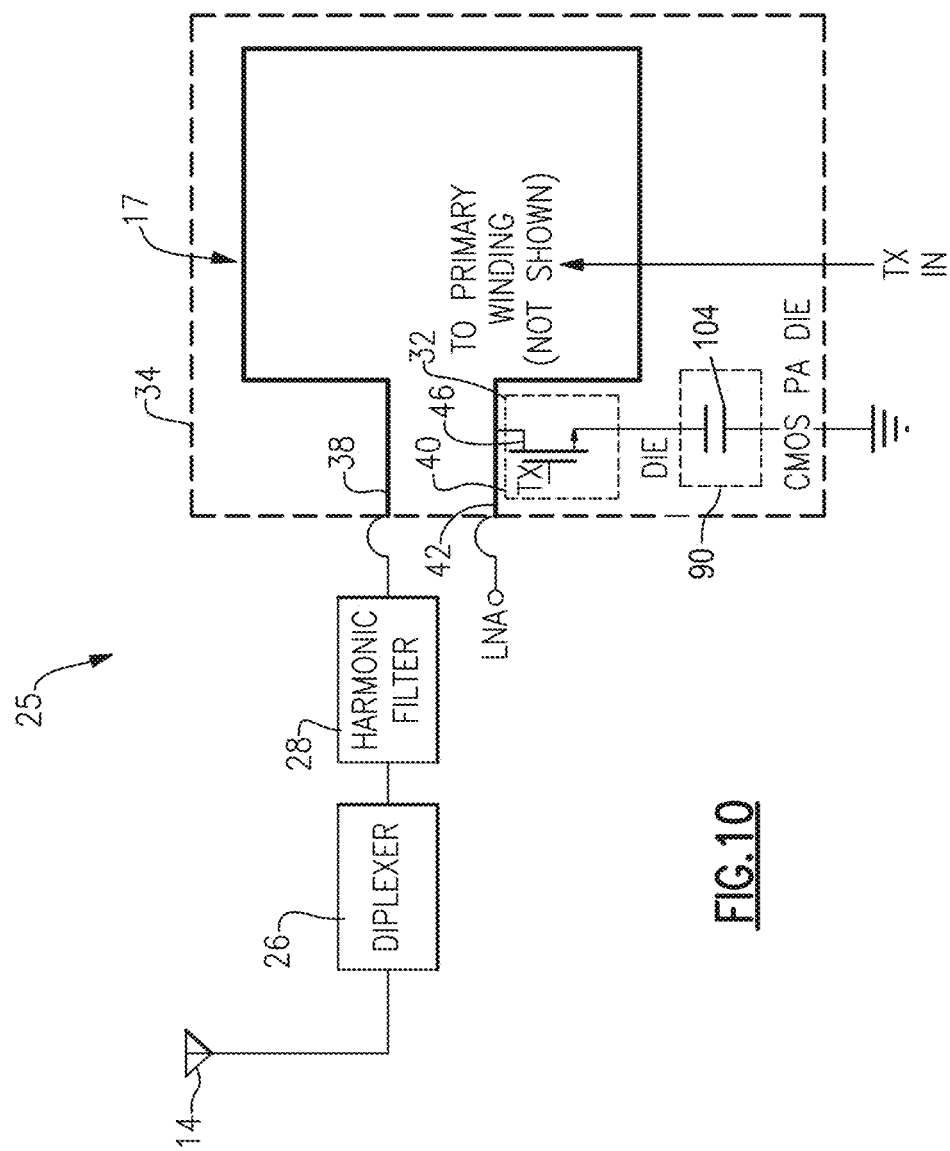
FIG. 10 is a schematic diagram of a portion of one embodiment of a wireless device including a compensation circuit.

FIG. 10 depicts a portion of a wireless device similar to that shown in FIG. 3, but with a compensation circuit 90 including a capacitor 104 included on the die 34 in the path between the switch 32 and ground.

For the purposes of illustration, many of the inventive apparatus and methods provided herein have been described in the context of power amplifiers, switches and other components built using CMOS processing, e.g., CMOS processing incorporating conventional silicon substrates (instead SOI substrates, for example). However, according to various embodiments, the apparatus and methods described herein can additionally be implemented using other, non-CMOS types of bulk silicon processing.

Example Front-End Module

Figure 11:
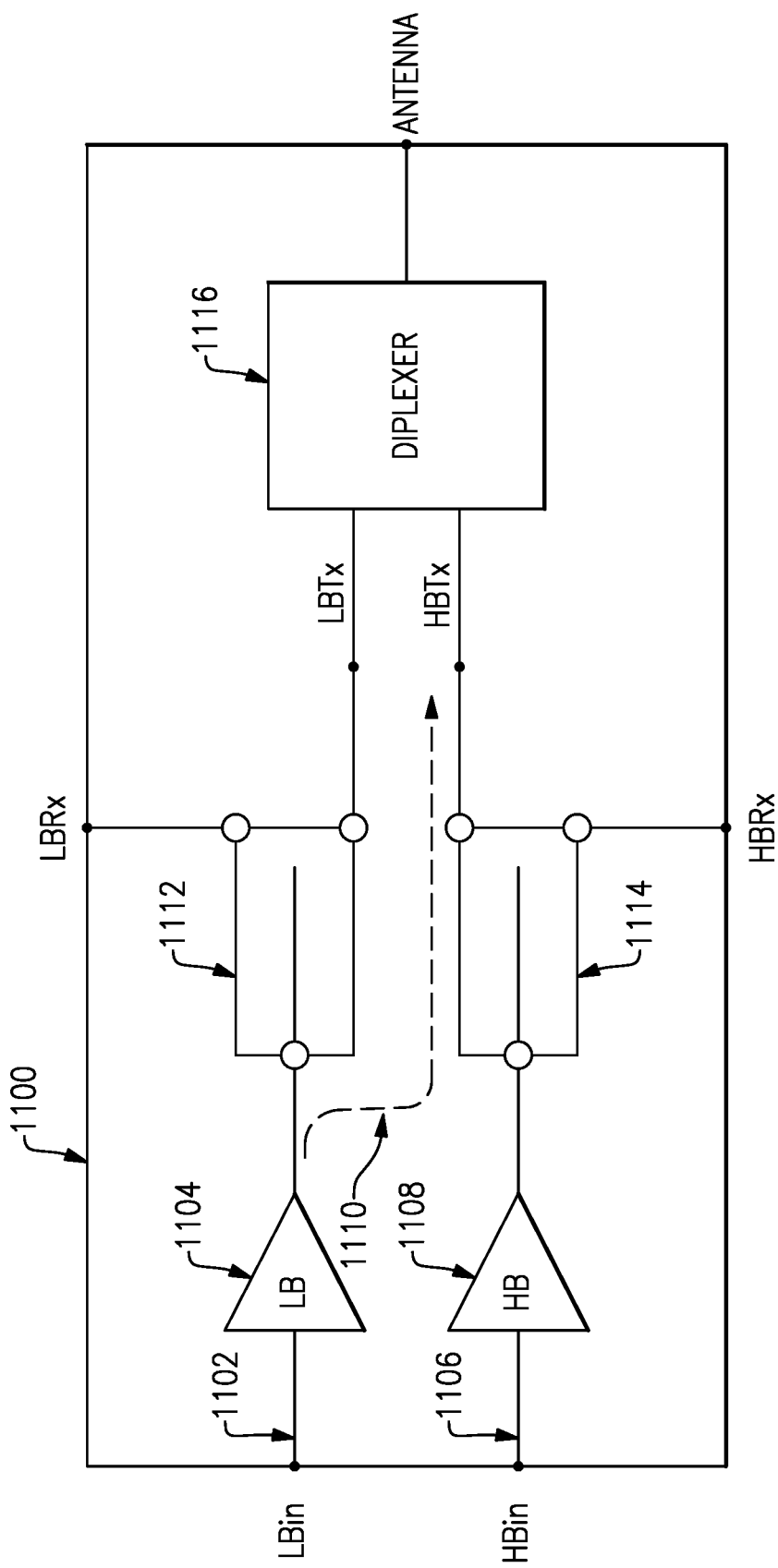
FIG. 11 illustrates a block diagram of an example of a front-end module (FEM) that includes multiple power amplifiers for processing multiple signal frequency bands.

FIG. 11 illustrates a block diagram of an example of a front-end module (FEM) 1100 that includes multiple power amplifiers 1104, 1108 for processing multiple signal frequency bands and supporting multiband communication. The PA 1104 may be referred to as a low-band PA and is configured to process a low-band signal. The PA 1108 may be referred to as a high-band PA and is configured to process a high-band signal. It should be understood that different frequencies may be designated as low-band or high-band based on, for example, the implemented communication standard. However, generally the low-band signal is of a lower frequency than the high-band signal. For example, the low-band signal may be 900 MHz and the high-band signal may be 1.8 GHz or 5.4 GHz. As another example, the low-band signal may be 1.8 GHZ and the high-band signal may be 5.4 GHz.

The low-band signal may be transmitted, or received, over the low-band signal path 1102 that includes the low-band PA 1104. The switch 1112 may be used to configure whether the signal path 1102 is operate as a transmit or a receive path. Similarly, the high-band signal may be transmitted, or received, over the high-band signal path 1106 that includes the high-band PA 1108. The switch 1114 may be used to configure whether the signal path 1106 is operate as a transmit or a receive path. As previously described, the FEM may also include a diplexer, such as the diplexer 1116 that can be used to filter between frequency bands of a received signal. Further, the diplexer can be used to combine the low-band path and the high-band path into a single path for output at an antenna pin that leads to an antenna. Often, the diplexer 1116 is a passive network.

Because of the desire to shrink the die size for the FEM 1100, the LB PA 1104 and the HB PA 1108 will be located near to each other regardless of attempts to separate them within the die. Thus, although typically only one power amplifier corresponding to one band will be active at a time, as illustrated by the dashed line 1110, in some cases cross-band interference may occur due to parasitic coupling between the signal path 1102 and 1106. This cross-band interference may occur when the high-band signal path 1106 is configured to process a signal that is an integer multiple of a signal that is processed by the low-band path 1102 due, for example, to harmonics that overlap with the signal. For example, if the low-band signal is 1.8 GHz and the high-band signal path 1106 is configured to transmit a 3.6 GHZ or a 5.4 GHz signal, then the second or third harmonic of the low-band signal may couple with the high-band signal path 1106. This coupling may occur because the high-band signal path is tuned to transmit a signal that comprises a harmonic of the low-band signal. This coupling may not exist when the power amplifiers are on separate dies or are sufficiently separated. However, it is becoming more common for power amplifiers to be on a shared die or to be in relatively close proximity due to the aforementioned desire to shrink devices and dies. Often, one power amplifier will be in tuning range of another power amplifier resulting in the parasitic coupling between the power amplifiers of the different signal harmonics. Size requirements often prevent the power amplifiers from being separated into different dies or being spaced far enough apart to reduce parasitic coupling. Embodiments described herein use active tuning to improve isolation between the power amplifiers and improve power amplifier performance compared to system that do not have active tuning or that suffer from parasitic coupling. Thus, in certain embodiments, not only can systems described herein detune a DAT during receive mode, but systems described herein can detune a non-transmitting DAT power amplifier to prevent coupling with a transmitting DAT power amplifier.

Example MCM

Figure 12:
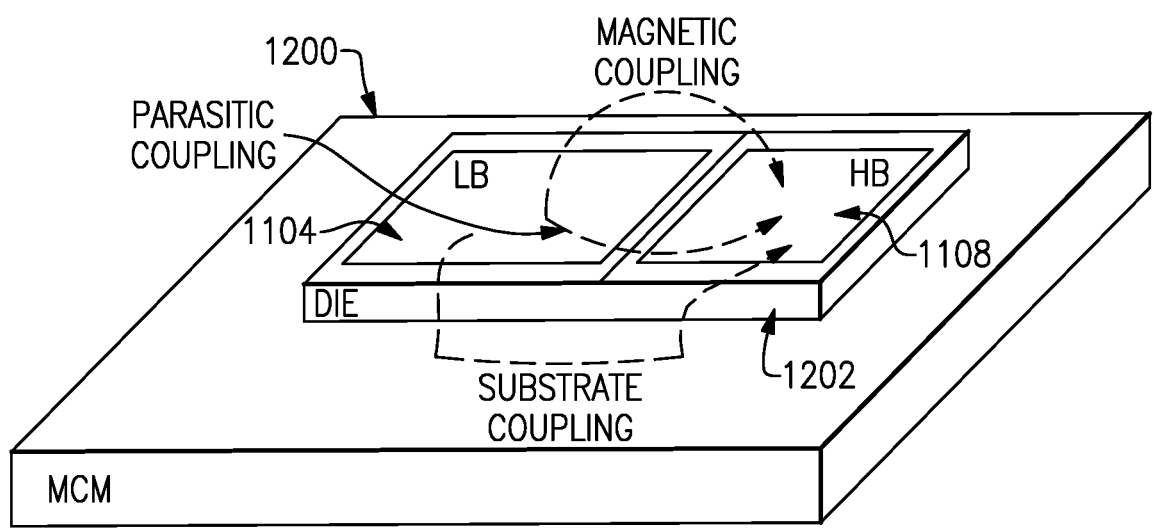
FIG. 12 illustrates a block diagram of an example of a multi-chip module that can implement at least a portion of the FEM of FIG. 11.

FIG. 12 illustrates a block diagram of an example of a multi-chip module (MCM) 1200 that can implement at least a portion of the FEM 1100 of FIG. 11. As previously described, it is often desirable to reduce the size of components within a wireless device. As such, the MCM may include multiple PAs. Further, as illustrated in FIG. 12, in some implementations a plurality of PAs may be combined on the same die 1202. For instance, the low-band PA 1104 may be combined with the high-band PA 1108 on the same die. Advantageously, in certain embodiments, combining multiples PAs on the same die enables the MCM 1200, which may correspond to the FEM 1100, to be reduced in size. In cases where the high-band signal is not an integer multiple of the low-band signal, the LB PA 1104 and the HB PA 1108 can be combined with minimal or no drawbacks due to the reduced cross-band isolation that occurs by the proximity of the PAs to each other.

However, in cases where the high-band signal is an integer multiple of the low-band signal, the lack of physical separation between the HB PA 1108 and the LB PA 1104 can result in parasitic coupling, magnetic coupling, and/or substrate coupling between the HB PA 1108 and the LB PA 1104. These couplings can cause a signal to exist on the non-transmitting signal path (e.g., the high-band signal path), which can interfere with the transmission of a signal over the transmitting signal path (e.g., the low-band signal path).

Passive techniques can be used to reduce the cross-band interference. For example, highly resistive substrates, ground shielding, or disparate orientation of the signal paths associated with the LB PA 1104 and the HB PA 1108 can be used to reduce the power coupling between the signal paths. However, because of the desire to eliminate the off-chip switch that provides additional signal isolation, these passive techniques are often insufficient when used alone. As described in the present disclosure, the use of active detuning of the non-transmitting PA can reduce or eliminate any remaining power coupling between the LB and HB signal paths.

Parasitic Coupling Reduction

Figure 13:
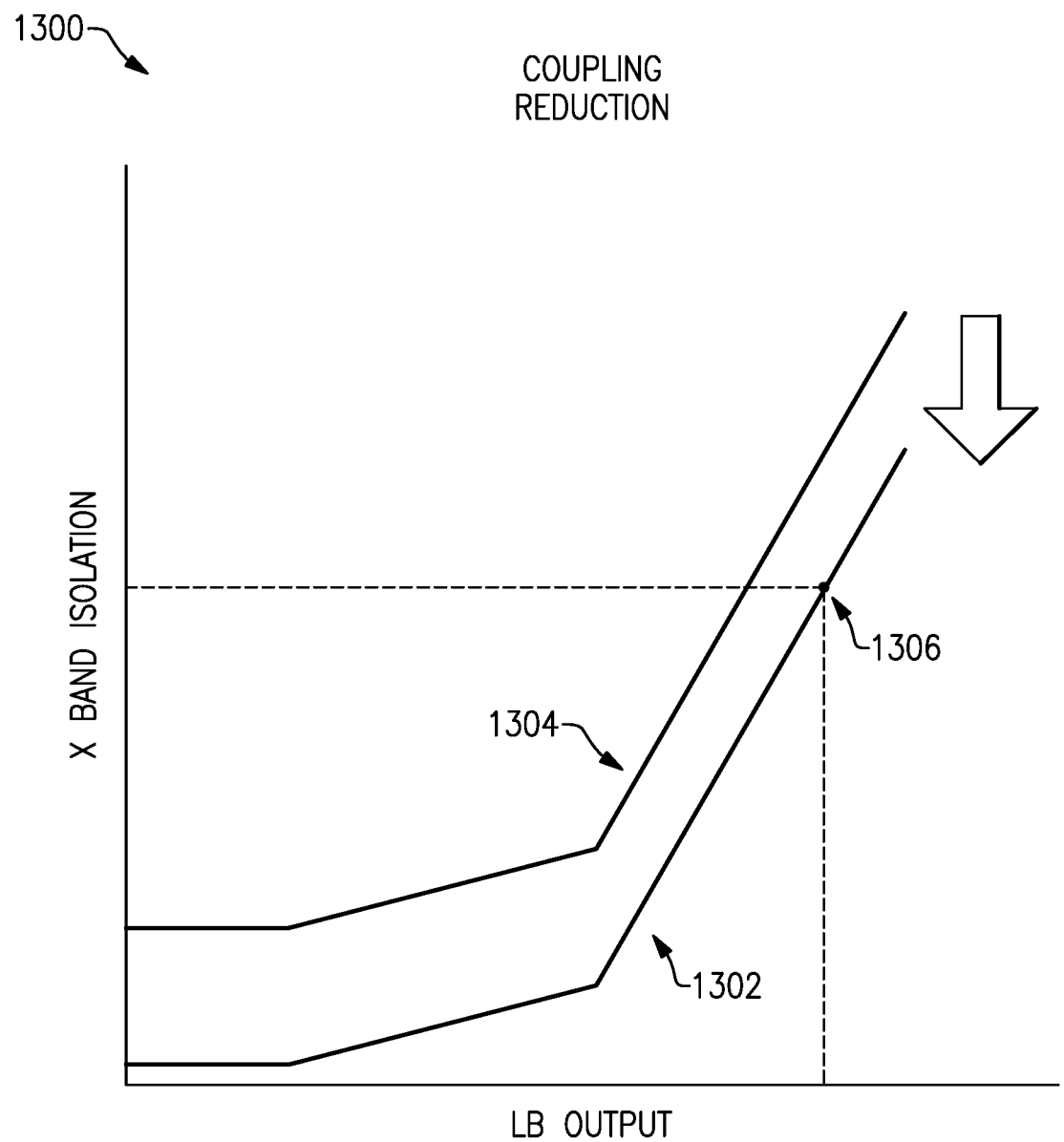
FIG. 13 illustrates conceptually the reduction in parasitic coupling resulting from embodiments of the present disclosure.

FIG. 13 illustrates conceptually the reduction in parasitic coupling resulting from embodiments of the present disclosure. The graph 1300 illustrates the output of a low-band amplifier (e.g., the LB PA 1104) versus the power coupling (or cross band isolation) on the HB signal path due, for example, to signal harmonics of the LB signal that match the high-band. The line 1304 illustrates the amount of power coupling without using the systems disclosed herein. It is desirable to reduce the amount of coupling to match the line 1302. Embodiments of the systems disclosed herein that implement the active detuning of the high-band PA improve the cross-band isolation and reduce the amount of parasitic coupling. As a result, the line 1304 drops and approached or, in some cases, matched the line 1302.

Example Power Amplifier Module

Figure 14:
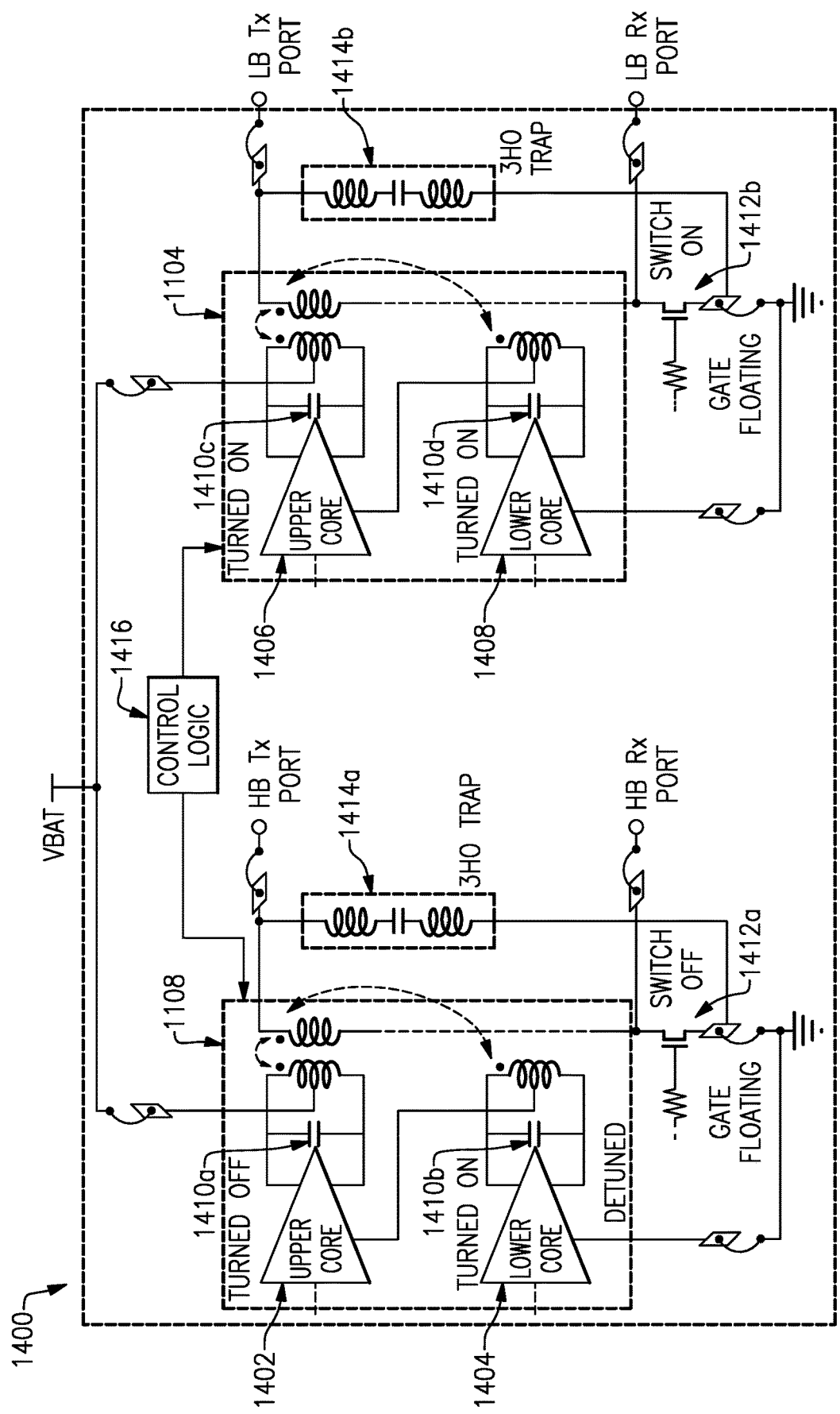
FIG. 14 illustrates a circuit diagram of an example of a portion of a power amplifier module including multiple power amplifiers.

FIG. 14 illustrates a circuit diagram of an example of a portion of a power amplifier module (PAM) 1400 including multiple power amplifiers. These power amplifiers may correspond to the power amplifiers 1104 and 1106 that can be implemented on a single die and/or within a multi-chip module (MCM). Each of the power amplifiers 1104 and 1108 may be DAT-type power amplifiers and may include some or all of the embodiments described with respect to the power amplifier 17. The PAM 1400 may be included as part of a front-end module (e.g., the FEM 1100).

As previously indicated, the PA 1104 is a low-band PA and the PA 1108 is a high-band PA. In the illustrated embodiment of FIG. 14, the LB PA 1104 is configured to transmit a signal and the HB PA 1108 is configured in a non-transmitting mode. However, during operation, the HB PA 1108 may be configured to transmit and the LB PA 1104 may be configured in a non-transmitting mode. In such cases, the configuration of the circuit elements as illustrated and described below would be reversed.

In the LB PA 1104, both the upper core 1406 and the lower core 1408 of the primary winding are turned on or active. These cores 1406 and 1408 include one or more pairs of transistors that may correspond to the amplifier stages 70 and 72, respectively. These transistors may be n-channel metal-oxide-semiconductor (NMOS) transistors. However, the transistors are not limited as such and may include other types of transistors, such as PMOS, CMOS, and the like.

The upper core 1406 may be electrically connected to the outer primary winding 66 and drives the outer primary winding 66. The lower core 1408 may be electrically connected to the inner primary winding 68 and drives the inner primary winding 68. In the illustrated example, the LB PA 1104 is configured in a transmit mode, and the primary windings 66 and 68 are being energized. When the cores are active, the transistors of the cores are configured such that the amplifier stages of the upper core 1406 and the lower core 1408 function as differential transistor amplifiers or differential amplifiers. When functioning as a differential amplifier the transistors of the transistor pair that are included in the upper core 1406 and the lower core 1408 may alternately be turned on and off. For example, with reference to FIG. 6, the transistor 78a may be turned on while the transistor 78c is turned off and vice versa. Conceptually, the transistors can be considered a single pair of transistors with one transistor of the pair of transistors connected from one side of the capacitor to ground and the other transistors of the pair of transistors connected from the other side of the capacitor to ground. However, as illustrated in FIG. 6, the pair of transistors may be implemented as multiple transistors in series. Thus, a set of transistors may be connected from one side of the capacitor to ground and another corresponding set of transistors can be connected from the other side of the capacitor to ground.

Returning to FIG. 14, each of the upper core 1406 and the lower core 1408 may be electrically connected to a tuning capacitor 1410c and 1410d, respectively. These tuning capacitors 1410c, 1410d may be connected in a similar manner as the tuning capacitors 80 and 84 illustrated in FIG. 6. In other words, each tuning capacitor may be connected between a pair of transistors. Further, as previously discussed each transistor of the pair of transistors may be formed from a series of a plurality of transistors. Each of the capacitors 1410c and 1410d may help tune the differential amplifiers of the upper core 1406 and the lower core 1408, respectively, based on the frequency associated with the LB PA 1104. For example, the capacitors 1410c and 1410d will be tuned differently for a 900 MHz LB PA compared to a 1.8 GHz LB PA. Typically, because the LB PA 1104 is configured to operate at a particular static frequency, the capacitors 1410c and 1410d are not variable. However, in some embodiments, the LB PA 1104 can be reconfigured to operate across multiple bands. In some such embodiments, the capacitors 1410c and 1410d may be tunable capacitors.

When the LB PA 1104 is operating in a transmit mode, the switch 1412b will be turned on. By turning on the switch 1412b, the secondary winding is connected to ground and the signal received by the LB PA 1104 may be provided to the antenna via the LB transmit port. Further, the harmonic trap 1414b may be configured to filter or remove one or more undesired harmonics from the signal to be transmitted. For example, as illustrated, the harmonic trap 1414b may be configured as a third harmonic trap. Generally, the signals transmitted are high-frequency and the third harmonic is sufficiently high that the third harmonic trap 1414a, 1414b can be connected directly to ground instead of to the switch 1412a, 1412b, respectively. Advantageously, connecting the harmonic traps 1414a, 1414b directly to ground can improve the quality factor of the harmonic traps. However, in certain embodiments, the harmonic traps 1414a, 1414b can be connected to ground via the switches 1412a, 1412b, respectively.

When the LB PA 1104 is transmitting, the HB PA 1108 is meant to be off. However, as previously explained, when the LB PA 1104 is transmitting, some of the power may be coupled to the HB PA 1108 when the HB is an integer multiple of the LB due, for example, to the power coupling of the harmonics and the non-linearity of the transistors. This, coupling can cause undesirable consequences, such as spurious emissions from the HB PA 1108. To reduce or prevent the coupling with the HB PA 1108, the control logic 1416 may configure the HB PA 1108 such that one of the cores 1402 or 1404 is detuned. By detuning one of the lower core or the upper core 1402 or 1404, the transmission path of the HB PA 1108 will no longer be optimally configured to transmit at the high band frequency. Consequently, the transmission path of the HB PA 1108 will no longer be configured to match one of the harmonics of the lower band resulting in reduced coupling with the LB PA 1104.

Detuning the cores 1402 or 1404 may include shorting or opening the transistors. However, it is typically desirable to not create a power to ground short. Thus, when shorting the detuned core, typically only one core will be detuned to prevent creating the power to ground short. In the illustrated example, the lower core 1404, which is turned on, may be shorted and the upper core 1402, which is turned off, may be open. In some cases, the decision of which core to detune and how to detune the selected core depends on the layout of the PAM 1400. For example, the relative orientation of the two power amplifiers to each other may affect the amount of coupling and the selection of the core to detune may impact the effectiveness of the detuning. Thus, different implementations may select different cores from the upper core 1402 and the lower core 1404 to detune.

Further, it should be understood that some circuit configurations are possible that enable both cores to be detuned while avoiding a power to ground short. For example, an additional switch may be inserted between the power supply and the ground that can be opened when the cores are detuned to prevent this power to ground short.

The control logic 1416 may be a digital logic block and/or a lookup table that configures the PAs 1104 and 1108 based on a control signal received at the PAM 1400. Alternatively, the control logic 1416 may be a hardware processor that determines control signals for the PAs 1104 and 1108 based on one or more inputs that can include a control signal, a frequency selection, metadata for the base station and any other information that can be used to determine the PA to activate and/or the PA to detune.

The control logic 1416 can cause the lower core 1404 of the HB PA 1108 to be detuned by configuring both transistors of the transistor pair included in the lower core 1404 to be activated and shorted to ground. By shorting the transistor pair to ground, the capacitor 1410b, which normally tunes the inner primary winding of the HB PA 1108, is effectively removed from the circuit as both terminals of the capacitor 1410b are connected to ground. Consequently, the tuning of the HB PA 1108 is modified reducing the occurrence of parasitic coupling by one of the harmonics of the signal transmitted by the LB PA 1104. In cases where each transistor in the transistor pair is implemented as a series of transistors, the series of transistors may be shorted to ground. Further, when the LB PA 1104 is transmitting, the switch 1412a connected to the HB PA 1108 is configured to be off or open.

Generally, it is sufficient to detune one of the primary windings of the HB PA 1108. Further, it is undesirable to short the supply voltage VBAT to ground. Thus, the upper core 1402 may not be detuned by the control logic 1416 and the capacitor 1410a that is used to tune the upper core 1402 is not shorted to ground.

Although the switches 1412a and 1412b are illustrated as external to the PAs 1104 and 1108, respectively, in some implementations, the switches 1412a and 1412b are included as part of the respective PAs 1104 and 1108. Moreover, because the switches 1412a and 1412b are located on the side of the PAs with the secondary winding, when the lower cores are shorted to ground, the switches are unlikely to receive a high voltage and are therefore, unlikely to enter the breakdown region. Further, as with the LB PA 1104, the HB PA 1108 may be connected to a harmonic trap 1414a when the HB PA 1108 is active or transmitting. The harmonic trap 1414a can filter or remove harmonics of the high band signal.

The ability to configure the transistors of the lower core 1404 while the LB PA 1104 is transmitting helps reduce the power coupling between the transmission paths. This active solution to the problem of parasitic coupling can be combined with the previously referenced passive solutions to help achieve a desired harmonic isolation. For example, in some embodiments, the combination of the active and passive solutions can achieve −40 dBm isolation. Further, disclosed embodiments can be used to reduce parasitic coupling, substrate coupling, magnetic coupling any and other power transfer between signal paths, such as between the low-band signal path and the high-band signal path.

With non-DAT power amplifiers implemented in CMOS, the ability to reconfigure the PAs at run-time has been limited because, for example, the switching elements will break down at higher power levels (e.g., at power levels exceeding 1 or 2 Watts). One of skill in the art will understand that this breakdown voltage may vary due to a number of factors, such as changes in the size of the transistors. Advantageously, however, in certain embodiments, the use of the DAT PAs enables the reuse of the switches within the lower and upper cores of the DAT PAs to achieve the reduced coupling between the PAs. Thus, an active solution can be combined with one or more passive solutions to achieve the desired reduced coupling between the PAs.

The FEM 1400 has been described as it may be configured when the LB PA 1104 is transmitting and the HB PA 1108 is inactive, or not transmitting. It should be understood that the configuration may be reversed when the HB PA 1108 is transmitting and the LB PA 1104 is inactive, or not transmitting. For example, in such a case, the lower core 1408 of the LB PA 1104 may be detuned and the switch 1412b may be off while the lower core 1404 of the HB PA 1108 will be tuned and the switch 1412a may be on.

Example Parasitic Coupling Reduction Process

Figure 15:
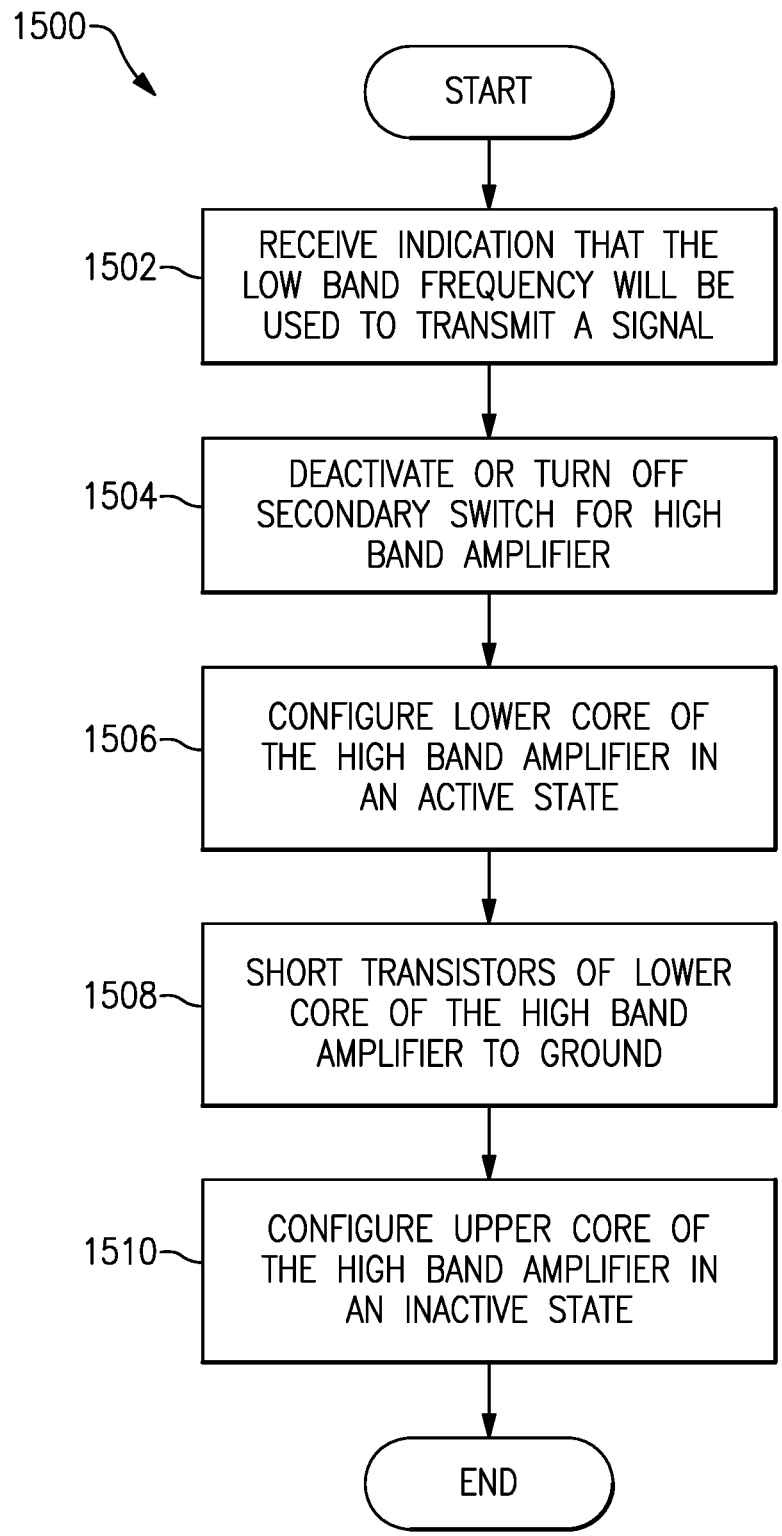
FIG. 15 illustrates a flowchart of an example of a parasitic coupling reduction process.

FIG. 15 illustrates a flowchart of an example of a parasitic coupling reduction process 1500. It should be understood that the process 1500 is one example of a process for reducing parasitic coupling. Other processes are possible for reducing parasitic coupling or other types of power coupling between devices, such as a pair of PAs. For example, operations of the process 1500 may be performed in a different order or substantially in parallel. Thus, the order of the operations described with respect to the process 1500 is for ease of description and not to limit the process 1500. Further, although the process 1500 is described with respect to particular devices performing the operations, it should be understood that in certain embodiments, portions of the process 1500 may be performed by alternative elements. For instance, instead of the control logic 1416 of the PAM 1400 configuring the PA of the non-transmitting communication band, the baseband processor or control logic of the FEM may detune the PA.

The process 1500 begins at block 1502 when, for example, the control logic 1416 receives an indication that the low band frequency will be used to transmit a signal. The indication may be received in response to a command from a base station and/or from a baseband processor or a call processor on the wireless device. The selection of the low-band frequency may be based on the frequencies supported by the base station and/or the wireless device, the type of data being communicated (e.g., voice data or Internet data), the distance between the wireless device and the base station, etc.

At block 1504, the control logic 1416 deactivates, or turns off, the secondary switch 1412a for the high-band power amplifier 1108. Turning off the secondary switch 1412a may include opening the switch or otherwise making the switch high impedance so that the secondary winding of the high-band power amplifier 1108 is not connected to ground.

At block 1506, the control logic 1416 configures the lower core 1404, or the inner primary winding, in an active state. Configuring the lower core 1404 in an active state may include activating or turning on both transistors for the pair of transistors included in the lower core 1404. The pair of transistors of the lower core 1404 is activated substantially at the same time and/or are active at the same time for at least a portion of time. As previously described, each transistor of the pair of transistors may be implemented as a series of transistors. Thus, the block 1506 may include activating some or all of the transistors representative of the pair of transistors.

The control logic 1416 shorts the transistors of the lower core 1404 to ground at block 1508. By shorting the transistors to ground, the capacitor that is connected between the transistor pair may be shorted to ground, which effectively removes the capacitor from the circuit and stops the tuning that is provided by the capacitor. Thus, the tuning created by the product of the inductance of the inner primary winding and the capacitance no longer matches the desired tuning for the high band frequency (or low-band in the case that the high-band is being transmitted). In certain embodiments, the properties of the amplifier(s) that are not functional during transmission, which in this non-limiting example is the high-band PA, are changed so as to improve performance of the amplifier that is functional during transmission of a signal, which in this non-limiting example is the low-band PA. Thus, in certain embodiments, not only are non-transmitting PAs deactivated, but they are dynamically reconfigured to improve the overall performance of the system.

It is generally unnecessary to detune the upper core 1402 because the inner and outer primary windings share the secondary winding as illustrated in FIG. 14. Thus, it is sufficient to detune the lower core 1404. However, in certain embodiments, the upper core 1402 may also be detuned by, for example, modifying the value of the capacitor 1410*a*.

The control logic 1416, at block 1510, configures the upper core 1402, or the outer primary winding, to be in an inactive state. Configuring the upper core 1402 to be in an inactive state may include turning off or not supplying power to the transistors for each pair of transistors included in the upper core 1402.

Although the process 1500 is described as detuning the high-band PA 1108 in response to an indication that the low-band PA 1104 is or will be processing a signal for transmission, the present disclosure is not limited as such. Instead, the process 1500 can be modified to detune the low-band PA 1104 in response to an indication that the high-band PA 1108 is or will be processing a signal for transmission. Further, the process 1500 is not limited to PAs, but can be applied to any number of PAs that may potentially experience power coupling between the PAs. For example, suppose that the PAM 1400 includes three PAs, a low-band PA, a mid-band PA, and a high-band PA. In this example, the process 1500 can be used to detune two of the three PAs while the third PA is configured to process a signal for transmission.

As previously described, the problems discussed herein may occur when, for example, the HB is an integer multiple of the LB. However, in cases where the high-band signal is not an integer multiple of the low-band signal, the problem of coupling between the communication paths due to the signal harmonics is reduced or eliminated. Thus, in certain embodiments, the process 1500 may include determining whether the non-transmitting PAs or communication paths are integer multiples of the transmitting frequency and selectively implementing the remainder of the process 1500 based on the result of this determination. In cases where a wireless device is configured to support only two communication bands, it may be known ahead of time whether there is a risk of power coupling between the communication paths. However, with wireless devices that support more than two bands, the power coupling may occur for some bands, but not for others. Thus, certain embodiments of the present disclosure may include a determination of whether to detune one or more DAT PAs based on the selected transmission frequency.

Applications

Some of the embodiments described above have provided examples in connection with wireless devices or mobile phones. However, the principles and advantages of the embodiments can be used for any other systems or apparatus that have needs for the embodiments described herein.

Such embodiments can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Additional Embodiments

According to certain aspects of the disclosure, a complementary metal oxide semiconductor (CMOS) die is provided comprising a power amplifier. The power amplifier includes a transformer having a primary winding and a secondary winding. The power amplifier can be configured in a transmit mode to amplify a radio frequency (RF) transmit signal received on the primary winding and to provide an amplified RF transmit signal on an antenna side of the secondary winding. The power amplifier can be further configured in a receive mode to transmit an RF receive signal from the antenna side of the secondary winding to a receive side of the secondary winding. The CMOS die can further include a transmit/receive switch between the receive side of the secondary winding and a bond pad of the die. The CMOS die can be formed using conventional bulk CMOS processing, for example (e.g., without using semiconductor-on-insulator [SOI] processing technology).

In a transmit mode the transmit/receive switch can be configured to be closed, creating a low impedance path from the receive side of the secondary winding to the bond pad. In a receive mode the transmit/receive switch can be configured to be open, creating a high impedance path from the receive side of the secondary winding to the bond pad.

The CMOS die can further comprise a receive port in electrical communication with the receive side of the secondary winding. The switch can include a first terminal in electrical communication with the receive side of the secondary winding, a second terminal in electrical communication with the bond pad, and a control input that receives a transmit/receive control signal. The transmit/receive switch can be a single transistor, for example.

The CMOS die can further comprise a compensation circuit disposed between the switch and the bond pad. The compensation circuit can be configured to improve isolation of the receive port from the RF transmit signal in the transmit mode. The compensation circuit can include a capacitor, for example. The compensation circuit can counteract a reactance of a bond wire positioned in a path between the bond pad and the switch.

A variety of implementations are possible. For instance, the bond pad can connect to a ground reference. Moreover, the power amplifier can include a plurality amplifier driver stages connected to the primary winding.

The primary winding in some implementations receives a set of bias signals having a first set of values in the transmit mode to bias the primary winding in a first state, and having a second set of values in a receive mode to bias the primary winding in a second state in which a difference between center frequencies of the primary winding and the secondary winding is greater than when the primary winding is biased in the first state.

The power amplifier can be a distributed active transformer-type power amplifier. A geometry of the secondary winding generally matches a geometry of the primary winding in some configurations. For instance, the primary winding in some implementations has an inner winding generally conforming to an interior boundary of the secondary winding and an outer winding generally conforming to an exterior boundary of the secondary winding.

According to additional aspects of the disclosure a wireless device is provided comprising a radio frequency (RF) antenna and a semiconductor die. The semiconductor die can have a power amplifier which includes a transformer having a primary winding and a secondary winding. The power amplifier can be configured in a transmit mode to amplify an RF transmit signal received on the primary winding and provide an amplified RF transmit signal on an antenna side of the secondary winding. The power amplifier can be further configured in a receive mode to transmit an RF receive signal from the antenna side of the secondary winding to a receive side of the secondary winding. The die can further include a transmit/receive switch between the receive side of the secondary winding and a bond pad of the die.

In a transmit mode the transmit/receive switch can be configured to close, creating a low impedance path from the receive side of the secondary winding to the bond pad, and in a receive mode the transmit/receive switch is configured to open, creating a high impedance path from the receive side of the secondary winding to the bond pad.

The semiconductor die is a complementary metal oxide semiconductor (CMOS) die in some implementations. For example, the CMOS die can be formed using conventional bulk CMOS processing (e.g., without using SOI processing technology).

According to yet additional aspects, a method of operating a radio frequency (RF) device is provided. The method can comprise, when the RF device is in an RF transmit mode: providing an RF transmit signal to a primary winding of a power amplifier included on a semiconductor die; amplifying the RF transmit signal with the power amplifier to provide an amplified version of the RF transmit signal on an antenna side of a secondary winding of the power amplifier; and controlling a transmit/receive switch positioned on the die between a receive side of the secondary winding and a bond pad of the die to create a low impedance path from the antenna side of the secondary winding to the bond pad. For example, the die can be formed using conventional bulk CMOS processing (e.g., without using SOI processing technology).

The creation of the low impedance path can result in improved isolation of an RF receive port of the die from the RF transmit signal.

The method can further comprise, when the RF device is an RF receive mode: receiving an RF receive signal on the antenna side of the secondary winding; and controlling the transmit/receive switch to create a high impedance path between the receive side of the secondary winding and the bond pad.

According to further aspects of the disclosure, a radio frequency (RF) device is provided comprising an antenna and a receive path configured to process RF receive signals detected by the antenna. The RF device can further include a switch positioned between a node in the receive path and a reference voltage such that the switch creates a low impedance path between the node and the reference voltage when the switch is on in an RF transmit mode and creates a high impedance path to the reference voltage when the switch is off in an RF receive mode. The RF device can further include a compensation circuit connected in series with the switch in a path extending from the switch to the reference voltage. The compensation circuit can act to limit a voltage swing present at the node in the receive path when the switch is closed in the RF transmit mode.

The compensation circuit can include a capacitor, for example. The compensation circuit can counteracts a reactance of a bond wire residing in the path between the switch and the reference voltage.

The RF device can further comprise a power amplifier, where the switch, the compensation circuit, and the power amplifier are integrated together on a semiconductor die with the power amplifier. The compensation circuit can resides on the semiconductor die between a first terminal of the switch and a bond pad of the semiconductor die. The node in the receive path in some configurations is electrically coupled to a second terminal of the switch and to a receive port of the semiconductor die. In some implementations, the power amplifier outputs an amplified RF transmit signal for delivery to the antenna when the RF device is in the RF transmit mode. The compensation circuit can improve isolation between the receive path and the RF transmit signal when the RF device is in the RF transmit mode. The die can be formed using conventional bulk CMOS processing (e.g., without using SOI processing technology).

The power amplifier can be a distributed active transformer-based power amplifier including a primary winding and a secondary winding, such as where the secondary winding can generally match the geometry of the primary winding. The primary winding can have an inner winding generally conforming to an interior boundary of the secondary winding and an outer winding generally conforming to an exterior boundary of the secondary winding. The primary winding can receive a set of bias signals having a first set of values in the RF transmit mode to bias the primary winding in a first state and having a second set of values in the RF receive mode to bias the primary winding in a second state in which the primary and secondary windings are detuned with respect to one another.

According to certain aspects of the disclosure, a semiconductor die is provided comprising a power amplifier configured to output an RF transmit signal and a receive path configured to communicate and process an RF receive signal. The semiconductor die can also include a switch positioned between a node in the receive path and a pad of the semiconductor die. The switch can create a low impedance path between the node and the pad when the switch is on in an RF transmit mode and create a high impedance path to the pad when the switch is off in an RF receive mode. The semiconductor die can further include a compensation circuit connected in series with the switch in a path extending from the switch to the pad. The compensation circuit can act to limit a voltage swing present at the node in the receive path when the switch is closed in the RF transmit mode. The die can be formed using conventional bulk CMOS processing (e.g., without using SOI processing technology).

The power amplifier can be a distributed active transformer-based power amplifier including a primary winding and a secondary winding, such as where the geometry of the secondary winding generally matches the geometry of the primary winding. The primary winding can have an inner winding generally conforming to an interior boundary of the secondary winding and an outer winding generally conforming to an exterior boundary of the secondary winding.

The compensation circuit can include a capacitor in some configurations, such as where the compensation circuit counteracts a reactance of a bond wire residing in a path between the switch and the pad.

According to yet further aspects of the disclosure a method of operating a radio frequency (RF) device is provided, where the comprises, when the RF device is in an RF transmit mode: providing an RF transmit signal to a power amplifier of the RF device; amplifying the RF transmit signal with the power amplifier to provide an amplified version of the RF transmit signal; and controlling a transmit/receive switch to create a low impedance path from a node in a receive path of the RF device to a reference voltage. The method can further comprise, with a compensation circuit positioned between the switch and the reference voltage, limiting a voltage swing present at the node in the receive path due to leakage of the RF transmit signal.

The compensation circuit can include a capacitor, and can limits the voltage swing by counteracting a reactance of a wire in the path between the switch and the reference voltage.

A radiofrequency (RF) device is provided according to some aspects of the disclosure. The RF device can comprise a power amplifier having a primary winding and a secondary winding, where the power amplifier configured in a transmit mode to amplify an RF transmit signal received on the primary winding and provide an amplified RF transmit signal on the secondary winding. The RF device can further comprise a controller configured, when the RF device is in a transmit mode, to bias the primary winding in a first state and, when the RF device is in a receive mode, to bias the primary winding in a second state in which a difference between center frequencies of the primary winding and the secondary winding is significantly greater than when the primary winding is biased in the first state.

The RF device can further comprise a transmit/receive switch coupled to a receive side of the secondary winding. The power amplifier and the switch can reside together on a complementary metal oxide semiconductor (CMOS) die. The switch can configured to close in a transmit mode thereby creating a low impedance path from a receive side of the secondary winding to a bond pad of the die, and further configured to open in a receive mode thereby creating a high impedance path from the receive side of the secondary winding to the bond pad. The CMOS die in some implementations further includes a receive port in electrical communication with the receive side of the secondary winding. The switch can include a first terminal in electrical communication with the receive side of the secondary winding, a second terminal in electrical communication with the bond pad, and a control input receiving a transmit/receive switching control signal. The switch can include a single transistor in some configurations. The CMOS die can be formed using conventional bulk CMOS processing (e.g., without using SOI processing technology).

The RF device can further comprising a compensation circuit disposed between the switch and the bond pad and configured to improve isolation of the receive port from the RF transmit signal in the transmit mode. The compensation circuit can include a capacitor for example, and can counteract a reactance of a bond wire positioned in a path between the bond pad and the switch.

The bond pad can be a ground bond pad in some cases. The power amplifier can include a plurality amplifier driver stages connected to the primary winding, such as where the controller biases the primary winding by applying bias voltage levels to transistors in the amplifier driver stages.

The power amplifier can be a distributed active transformer-type power amplifier, for example, such as where a geometry of the secondary winding generally matches the geometry of the primary winding. The primary winding can have an inner winding generally conforming to an interior boundary of the secondary winding and an outer winding generally conforming to an exterior boundary of the secondary winding.

According to additional aspects of the disclosure, a method is provided of operating a wireless device. The method can include, in response to the wireless device entering a receive mode, biasing a primary winding of a power amplifier of the wireless device in a first state. The method can further include, in response to the wireless device entering a transmit mode, biasing the primary winding in a second state resulting in a transfer of energy from the primary winding to the secondary winding being significantly less than when the primary winding is biased in the first state.

The biasing of the primary winding in the first state can include applying a first set of bias voltage levels to transistors in amplifier driver stages of the primary winding. The biasing of the primary winding in the second state can include applying a second set of bias voltage levels to the transistors in the amplifier driver stages of the primary winding.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of operating a wireless device, the method comprising:
   receiving an indication that the wireless device is to transmit using a first frequency;
   turning off a secondary switch in communication with a secondary winding of a first power amplifier of the wireless device, the first power amplifier configured to process for transmission signals of a second frequency, the second frequency a harmonic of the first frequency;
   configuring a lower core of the first power amplifier in an active state; and
   configuring an upper core of the first power amplifier in an inactive state.

2. The method of claim 1 wherein configuring the lower core of the first power amplifier in an active state includes turning on a pair of transistors of the lower core, thereby shorting a capacitor connected between the pair of transistors to ground.

3. The method of claim 1 wherein configuring the lower core of the first power amplifier in an active state detunes the first power amplifier.

4. The method of claim 1 wherein configuring the upper core of the first power amplifier in an inactive state includes turning off a pair of transistors of the upper core.

5. The method of claim 1 wherein configuring the lower core of the first power amplifier includes turning on a pair of transistors of the lower core.

6. The method of claim 1 wherein the first power amplifier is configured to amplify the signals of the second frequency received on a primary winding of the first power amplifier and provide amplified signals of the second frequency on the secondary winding.

7. The method of claim 1 further comprising transmitting a signal of the first frequency by: configuring a second power amplifier to amplify the signal of the first frequency received on a primary winding of the second power amplifier; and providing the amplified signal of the first frequency on a secondary winding of the second power amplifier.

8. The method of claim 7 wherein said transmitting the signal of the first frequency further includes closing a first switch coupled to a receive side of the secondary winding of the second power amplifier.

9. The method of claim 7 wherein said transmitting the signal of the first frequency further includes opening a second switch coupled to a receive side of the secondary winding of the first power amplifier.

10. The method of claim 7 wherein said transmitting the signal of the first frequency further includes alternatingly turning on and off a pair of transistors of an upper core of the second power amplifier.

11. The method of claim 7 wherein said transmitting the signal of the first frequency further includes alternatingly turning on and off a pair of transistors of a lower core of the second power amplifier.

12. The method of claim 1 further comprising detuning the upper core of the first power amplifier by modifying a capacitance of a capacitor of the upper core of the first power amplifier.

13. The method of claim 1 further comprising:
   receiving an indication that the wireless device is to transmit using a third frequency;
   determining that the third frequency is not a harmonic of the first frequency or the second frequency; and
   transmitting a signal of the third frequency without detuning the first power amplifier.

14. A wireless device comprising:
   an antenna configured to transmit signals of a first frequency and signals of a second frequency, the second frequency a harmonic of the first frequency;
   a first power amplifier configured to amplify signals of the second frequency; and
   a controller configured to i) receive an indication to transmit using the first frequency, ii) turn off a secondary switch in communication with a secondary winding of the first power amplifier, iii) configure a lower core of the first power amplifier in an active state, and iv) configure an upper core of the first power amplifier in an inactive state.

15. The wireless device of claim 14 wherein the controller configures the lower core of the first power amplifier in an active state by turning on a pair of transistors of the lower core and shorting a capacitor connected between the pair of transistors to ground.

16. The wireless device of claim 14 wherein the controller configures the upper core of the first power amplifier in an inactive state by turning off a pair of transistors of the upper core.

17. The wireless device of claim 14 further comprising a second power amplifier configured to amplify a signal of the first frequency received for transmission, the signal received on a primary winding of the second power amplifier, and the amplified signal provided to a secondary winding of the second power amplifier.

18. The wireless device of claim 17 wherein the controller is further configured to cause the signal of the first frequency to be transmitted by at least closing a first switch coupled to a receive side of the secondary winding of the second power amplifier.

19. The wireless device of claim 17 wherein the controller is further configured to cause the signal of the first frequency to be transmitted by at least opening a second switch coupled to a receive side of the secondary winding of the first power amplifier.

20. The wireless device of claim 17 wherein the controller is further configured to cause the signal of the first frequency to be transmitted by at least alternatingly turning on and off a pair of transistors of an upper core of the second power amplifier and alternatingly turning on and off a pair of transistors of a lower core of the second power amplifier.

\* \* \* \* \*